United States Patent
Nakamura et al.

(10) Patent No.: US 9,515,123 B2
(45) Date of Patent: Dec. 6, 2016

(54) MAGNETIC MEMORY DEVICE AND MAGNETIC MEMORY

(71) Applicant: KABUSHIKI KAISHA TOSHIBA, Tokyo (JP)

(72) Inventors: Shiho Nakamura, Kanagawa (JP); Michael Arnaud Quinsat, Kanagawa (JP); Tsuyoshi Kondo, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/053,461

(22) Filed: Feb. 25, 2016

(65) Prior Publication Data
US 2016/0276404 A1  Sep. 22, 2016

(30) Foreign Application Priority Data
Mar. 19, 2015  (JP) .................................. 2015-056217

(51) Int. Cl.
*H01L 43/00* (2006.01)
*H01L 27/22* (2006.01)
(Continued)

(52) U.S. Cl.
CPC ............ *H01L 27/222* (2013.01); *H01L 43/02* (2013.01); *H01L 43/08* (2013.01); *H01L 43/10* (2013.01)

(58) Field of Classification Search
CPC ........ H01L 27/222; H01L 43/02; H01L 43/08; H01L 43/10
(Continued)

(56) References Cited

U.S. PATENT DOCUMENTS 6,829,121 B2 * 12/2004 Ikeda .................... G11C 11/16
                                                        360/324.1
6,834,005 B1  12/2004 Parkin
(Continued)

FOREIGN PATENT DOCUMENTS

JP  2010-62342  3/2010
JP  2013-69788  4/2013
(Continued)

OTHER PUBLICATIONS

Fukami, S., et al., "Current-induced domain wall motion in perpendicularly magnetized CoFeB nanowire", AIP | Applied Physics Letters, 98, pp. 082504-1-082504-3 (2011).
(Continued)

*Primary Examiner* — Kevin M Picardat
(74) *Attorney, Agent, or Firm* — Finnegan, Henderson, Farabow, Garrett & Dunner LLP

(57) ABSTRACT

A magnetic memory device according to an embodiment includes a first magnetic section, a read section, and a write section. The first magnetic section includes an extending portion. The extending portion extends in a first direction. The extending portion has a first interface and a second interface. The extending portion includes magnetic domains arranged along the first direction. Magnetization easy axis of the extending portion is directed along a second direction. The extending portion includes a first region and a second region. The first region contains at least one first element selected from a first group consisting of gadolinium, terbium, dysprosium, neodymium, and holmium. The second region contains at least one second element selected from a second group consisting of iron, cobalt, nickel, boron, silicon, and phosphorus. Concentration of the first element in the second region is lower than concentration of the first element in the first region.

15 Claims, 22 Drawing Sheets

(51) Int. Cl.
*H01L 43/02* (2006.01)
*H01L 43/08* (2006.01)
*H01L 43/10* (2006.01)

(58) Field of Classification Search
USPC .................................. 257/421, 295; 438/3
See application file for complete search history.

(56) References Cited

U.S. PATENT DOCUMENTS

| | | | |
|---|---|---|---|
| 6,898,132 | B2 | 5/2005 | Parkin |
| 7,952,905 | B2 | 5/2011 | Hwang et al. |
| 2010/0054033 | A1 | 3/2010 | Ochiai et al. |
| 2012/0068139 | A1* | 3/2012 | Daibou .................. H01L 43/10 257/2 |
| 2013/0069182 | A1 | 3/2013 | Ohsawa et al. |
| 2013/0108889 | A1* | 5/2013 | Piramanayagam .. G11B 5/3909 428/811.2 |
| 2013/0249025 | A1* | 9/2013 | Natori .................... H01L 43/02 257/421 |
| 2014/0085969 | A1* | 3/2014 | Saida .................. G11C 11/1675 365/158 |
| 2014/0140126 | A1 | 5/2014 | Morise et al. |
| 2014/0204487 | A1* | 7/2014 | Hase ...................... H01L 43/08 360/244 |

FOREIGN PATENT DOCUMENTS

| | | |
|---|---|---|
| JP | 2013-175756 | 9/2013 |
| JP | 2014-103260 | 6/2014 |

OTHER PUBLICATIONS

Li, S., et al., "Current-Induced Domain Wall Motion in TbFeCo Wires With Perpendicular Magnetic Anisotropy", IEEE Transactions on Magnetics, vol. 46, No. 6, pp. 1695-1698 (Jun. 2010).

\* cited by examiner

MAGNETIC MEMORY DEVICE AND MAGNETIC MEMORY

CROSS-REFERENCE TO RELATED APPLICATIONS

This application is based upon and claims the benefit of priority from Japanese Patent Application No. 2015-056217, filed on Mar. 19, 2015; the entire contents of which are incorporated herein by reference.

FIELD

Embodiments described herein relate generally to a magnetic memory device and a magnetic memory.

BACKGROUND

To increase the capacity of a memory, a three-dimensional memory of the spin shift register type using the movement of a magnetic domain wall has been proposed. Such a three-dimensional memory includes a magnetic section shaped like a narrow wire, a read section, and a write section. Magnetic domains corresponding to recording bits are arranged in the magnetic section. The magnetic domain is shifted on the magnetic section by e.g. current. Stable operation is desired in such a magnetic memory device.

DETAILED DESCRIPTION

Figure 1:
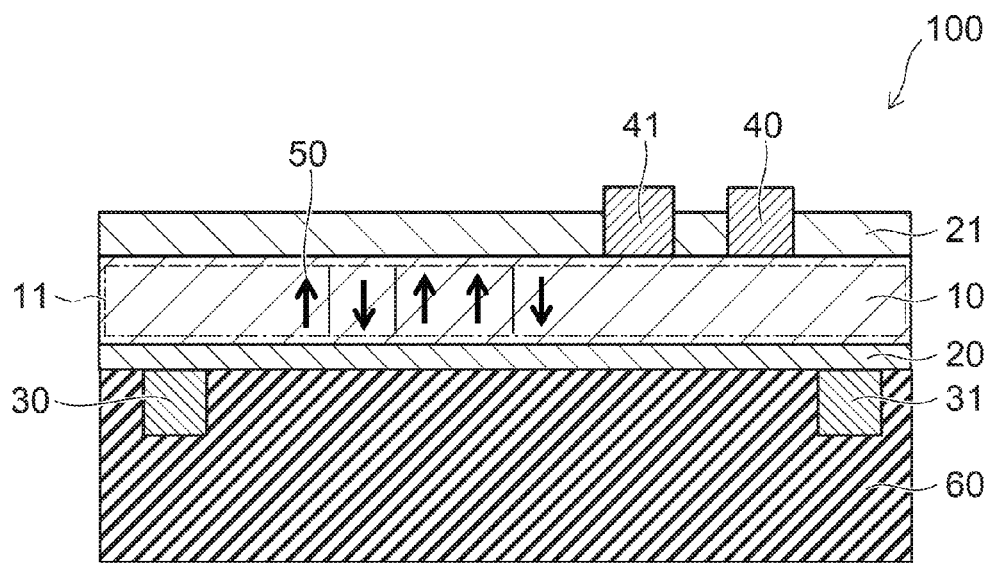
FIG. 1 is a sectional view showing a magnetic memory device 100 according to a first embodiment.

A magnetic memory device according to an embodiment includes a first magnetic section, a read section, and a write section. The first magnetic section includes an extending portion. The extending portion extends in a first direction. The extending portion has a first interface and a second interface. The second interface is on opposite side from the first interface. The first interface and the second interface extend along the first direction. The extending portion includes a plurality of magnetic domains. The magnetic domains are arranged along the first direction. Magnetization easy axis of the extending portion is directed along a second direction. The second direction crosses the first direction. The extending portion includes a first region and a second region. The first region is provided between the first interface and the second interface. The first region contains at least one first element selected from a first group consisting of gadolinium, terbium, dysprosium, neodymium, and holmium. The second region is provided between the first region and the first interface. The second region contains at least one second element selected from a second group consisting of iron, cobalt, nickel, boron, silicon, and phosphorus. Concentration of the first element in the second region is lower than concentration of the first element in the first region. The read section is configured to read magnetization direction of one of the magnetic domain in the extending portion. The write section is configured to control the magnetization direction of one of the magnetic domain in the extending portion.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In this specification and the drawings, components similar to those described previously are labeled with like reference numerals, and the detailed description thereof is omitted appropriately.

In some figures, part of the magnetic domains included in the magnetic section are marked with arrows to illustrate the magnetization direction of the magnetic domains.

First Embodiment

FIG. 1 is a sectional view showing a magnetic memory device 100 according to a first embodiment. The arrow indicated in the magnetic section 10 of FIG. 1 represents an example of the magnetization direction of the magnetic domain included in the magnetic section 10.

The magnetic memory device 100 includes a first magnetic section 10, a first layer 20, a second layer 21, a first electrode 30, a second electrode 31, a read section 40, and a write section 41. The magnetic memory device 100 is provided on e.g. a substrate 60.

The first magnetic section 10 includes an extending portion 11 extending in a first direction. The extending portion 11 includes a plurality of magnetic domains 50 arranged along the first direction. The magnetic domain 50 included in the extending portion 11 can move along the first direction. The extending portion 11 is a portion responsible for recording in a shift register. The first direction is e.g. the X-direction shown in FIG. 1.

The magnetization easy axis of the extending portion 11 is directed along a second direction crossing the first direction. The second direction is e.g. perpendicular to the first direction. The magnetization direction of the magnetic domain 50 included in the extending portion 11 is directed along e.g. the second direction. The magnetization direction of the magnetic domain 50 directed along the second direction can increase the density of the magnetic domains 50 in the extending portion 11 and stabilize the magnetic domains 50. The second direction is e.g. the Z-direction shown in FIG. 1. Alternatively, the second direction is e.g. the Y-direction shown in FIG. 1.

The extending portion 11 is provided between the first layer 20 and the second layer 21. The magnetic memory device 100 may not includes the first layer 20 and the second layer 21. The first electrode 30 and the second electrode 31 are connected to the extending portion 11. The second electrode 31 is connected to a portion of the extending portion 11 different from the portion of the extending portion 11 connected with the first electrode 30. The first electrode 30 and the extending portion 11 may be electrically connected through a portion of the first magnetic section 10 except the extending portion 11. Likewise, the second electrode 31 and the extending portion 11 may be electrically connected through a portion of the first magnetic section 10 except the extending portion 11.

The first electrode 30 and the second electrode 31 are connected to the extending portion 11 through e.g. the first layer 20 as shown in FIG. 1. The first electrode 30 and the second electrode 31 may be connected to the extending portion 11 through the second layer 21.

Alternatively, one of the first electrode 30 and the second electrode 31 may be connected to the extending portion 11 through the first layer 20. The other of the first electrode 30 and the second electrode 31 may be connected to the extending portion 11 through the second layer 21. The first electrode 30 and the second electrode 31 may be in direct contact with the extending portion 11.

The first electrode 30 and the second electrode 31 may be aligned with the extending portion 11 in the first direction. That is, the first electrode 30 and the second electrode 31 may be provided so that the extending portion 11 is located between the first electrode 30 and the second electrode 31 in the first direction.

The first electrode 30 and the second electrode 31 are used to pass a current in at least part of the extending portion 11. The magnetic domain wall included in the extending portion 11 is moved by passing a current in the extending portion 11. This results in moving the magnetic domain included in the extending portion 11.

The read section 40 and the write section 41 are e.g. in direct contact with the extending portion 11 as shown in FIG. 1. The read section 40 and the write section 41 may be connected to the extending portion 11 through the second layer 21. The read section 40 and the write section 41 may be connected to the extending portion 11 through the first layer 20.

Alternatively, one of the read section 40 and the write section 41 may be connected to the extending portion 11 through the first layer 20. The other of the read section 40 and the write section 41 may be connected to the extending portion 11 through the second layer 21. The read section 40 and the write section 41 may be provided so that part of the extending portion 11 is located between the read section 40 and the write section 41. Part of the first layer 20 or part of the second layer 21 may constitute part of the read section 40. Part of the first layer 20 or part of the second layer 21 may constitute part of the write section 41.

The read section 40 is used to read the magnetization direction of at least one of the magnetic domain included in the extending portion 11. The write section 41 is used to control the magnetization direction of at least one of the magnetic domain included in the extending portion 11. The read section 40 and the write section 41 may be the same component. That is, one component may have both the function of the read section 40 and the function of the write section 41.

FIGS. 2 to 5 illustrate the characteristics of the magnetic memory device.

FIGS. 2 to 5 show part of the extending portion 11 and examples of the concentration distribution of a first element and the concentration distribution of a second element in the second direction of the extending portion. In the figure shown on the right side of each of FIGS. 2 to 5, the concentration distribution of the first element is shown by the solid line. The concentration distribution of the second element is shown by the dashed line.

As shown in FIGS. 2 to 5, the extending portion 11 has a first interface S1 and a second interface S2. The first interface S1 and the second interface S2 extend along the first direction. The second interface S2 is an interface on the opposite side from the first interface S1. The first interface S1 is e.g. an interface between the first magnetic section 10 and the first layer 20. The second interface S2 is e.g. an interface between the first magnetic section 10 and the second layer 21.

The extending portion 11 includes a first region 11a, a second region 11b, and a third region 11c. The first region 11a, the second region 11b, and the third region 11c are provided between the first interface S1 and the second interface S2. The first region 11a is provided between the second region 11b and the third region 11c. That is, the first region 11a is provided between the second region 11b and the second interface S2 and between the third region 11c and the first interface S1. The second region 11b is provided between the first region 11a and the first interface S1. The third region 11c is provided between the first region 11a and the second interface S2.

The first region 11a contains at least one first element selected from a first group consisting of gadolinium (Gd), terbium (Tb), dysprosium (Dy), neodymium (Nd), and holmium (Ho). The second region 11b and the third region 11c contain at least one second element selected from a second group consisting of iron (Fe), cobalt (Co), nickel (Ni), boron (B), silicon (Si), and phosphorus (P). The second region 11b and the third region 11c may further contain the first element. The first region 11a may further contain the second element.

The second element includes e.g. at least one of Fe, Co, and Ni, and at least one of B, Si, and P. As an example, the second element is CoFeB, and the first element is Tb.

Figure 2:
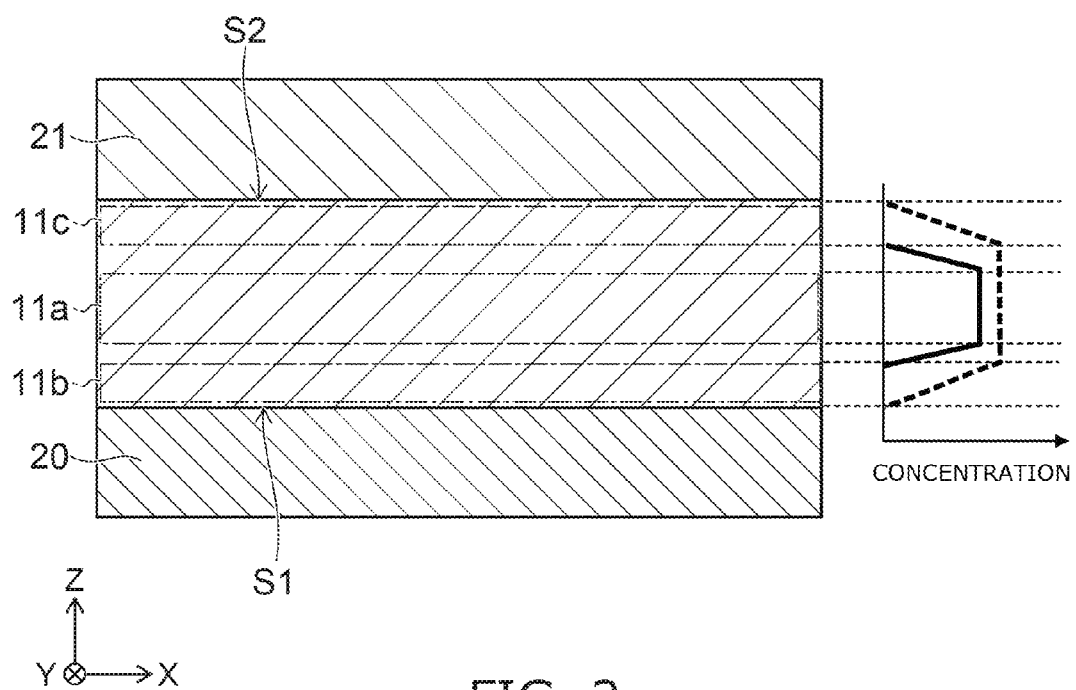
FIGS. 2 to 6 illustrate the characteristics of the magnetic memory device.

In the example shown in FIG. 2, the first region 11a contains the first element. The second region 11b and the third region 11c contain no first element. Alternatively, the amount of the first element contained in the second region 11b and the amount of the first element contained in the third region 11c are extremely smaller than the amount of the first element contained in the first region 11a.

That is, the concentration of the first element in the first region 11a is higher than the concentration of the first element in the second region 11b and the concentration of the first element in the third region 11c.

Figure 4:
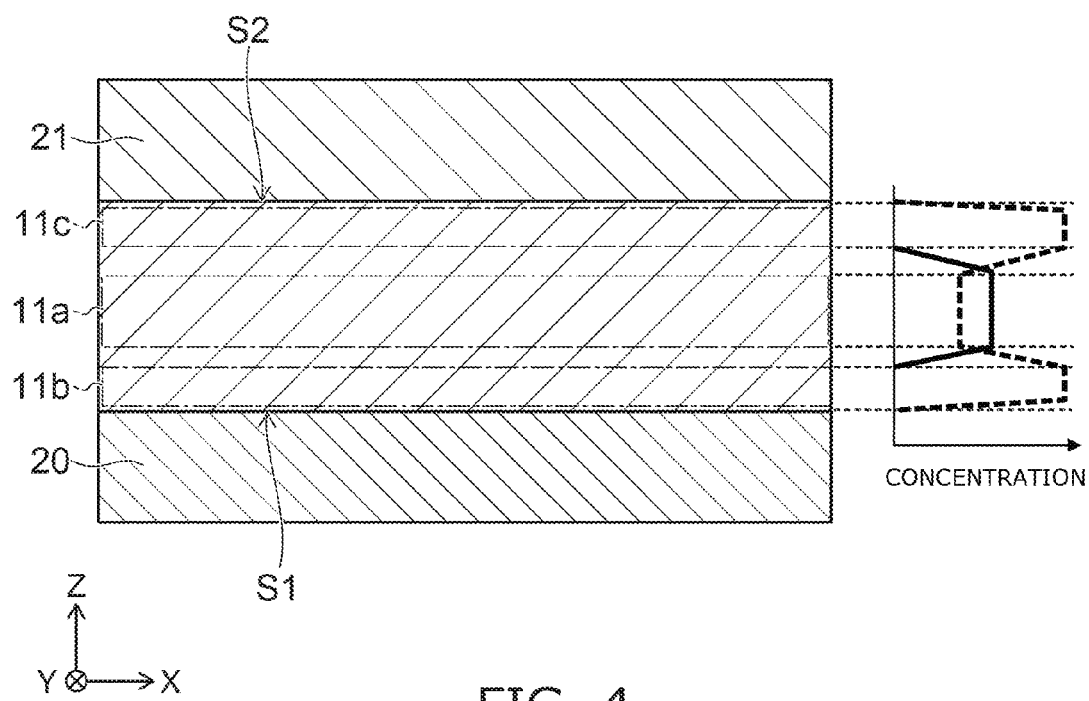
Figure 5:
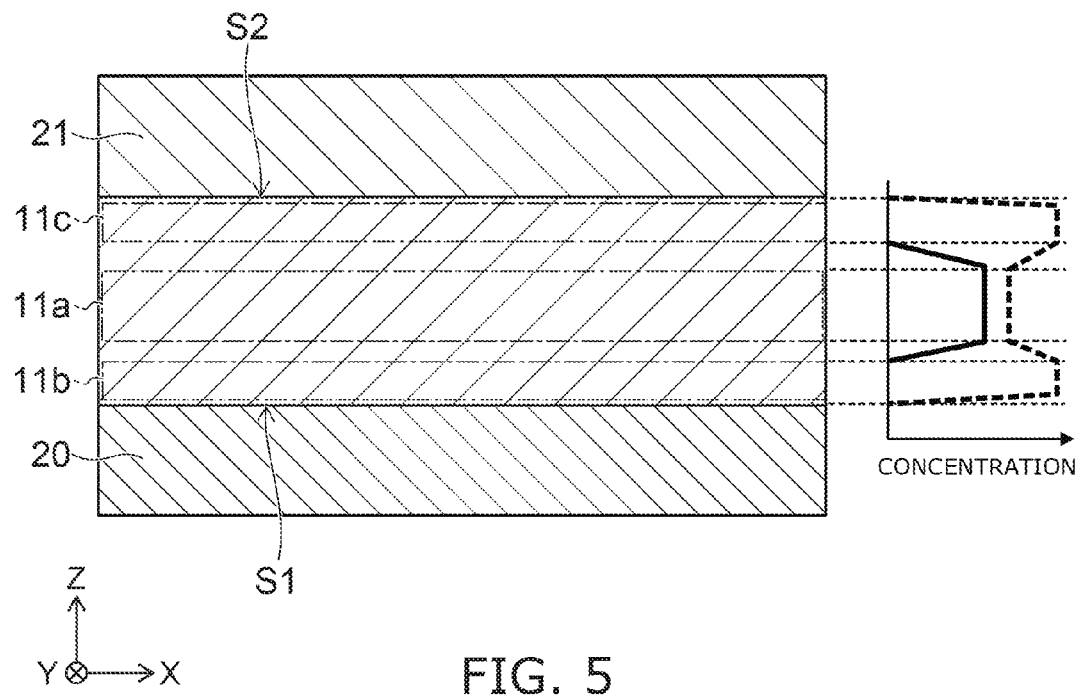

For instance, the concentration of the first element in the first region 11a is lower than the concentration of the second element in the first region 11a as shown in FIGS. 2 and 5. Alternatively, the concentration of the first element in the first region 11a may be higher than the concentration of the second element in the first region 11a as shown in FIGS. 3 and 4.

Figure 3:
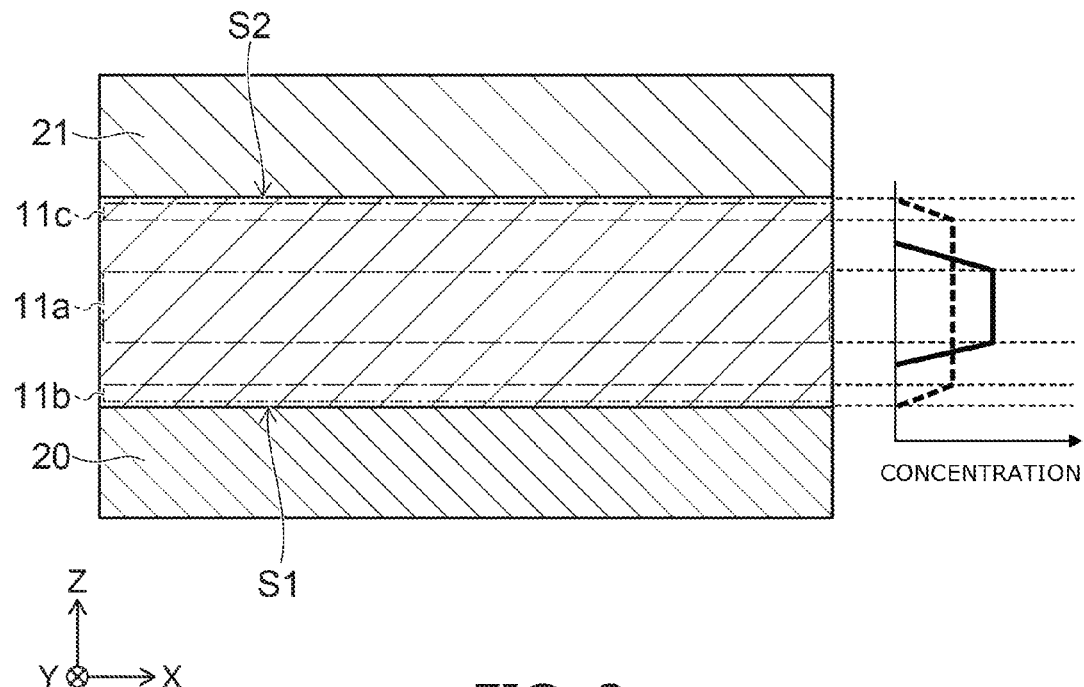

For instance, the concentration of the second element in the first region 11a is higher than the concentration of the second element in the second region 11b and the concentration of the second element in the third region 11c as shown in FIGS. 2 and 3.

Alternatively, the concentration of the second element in at least part of the first region 11a may be lower than the concentration of the second element in at least part of the second region 11b and the concentration of the second element in at least part of the third region 11c as shown in FIGS. 4 and 5.

The embodiment is not limited to the examples shown in FIGS. 2 to 5. The concentration of the second element in the first region 11a may be equal to at least one of the concentration of the second element in the second region 11b and the concentration of the second element in the third region 11c.

The concentration of the second element in the first region 11a is higher than the concentration of the first element in the second region 11b as shown in e.g. FIGS. 2 to 5.

The concentration of the first element in the first region 11a is higher than the concentration of the second element in the second region 11b and the concentration of the second element in the third region 11c as shown in e.g. FIG. 3. Alternatively, the concentration of the first element in the first region 11a is lower than the concentration of the second element in at least part of the second region 11b and the concentration of the second element in at least part of the third region 11c as shown in e.g. FIGS. 2, 4, and 5.

In the second region 11b and the third region 11c, the concentration of the second element is higher than the concentration of the first element. In the first region 11a, the concentration of the second element may be equal to the concentration of the first element. Alternatively, in the first region 11a, the concentration of the first element may be higher than the concentration of the second element as shown in FIGS. 3 and 4.

At least one of the first region 11a and the third region 11c may contain a third element. The third element includes at least one element selected from a third group consisting of tantalum (Ta), tungsten (W), iridium (Ir), platinum (Pt), palladium (Pd), copper (Cu), aluminum (Al), silver (Ag), gold (Au), carbon (C), magnesium (Mg), and hafnium (Hf).

Figure 6:
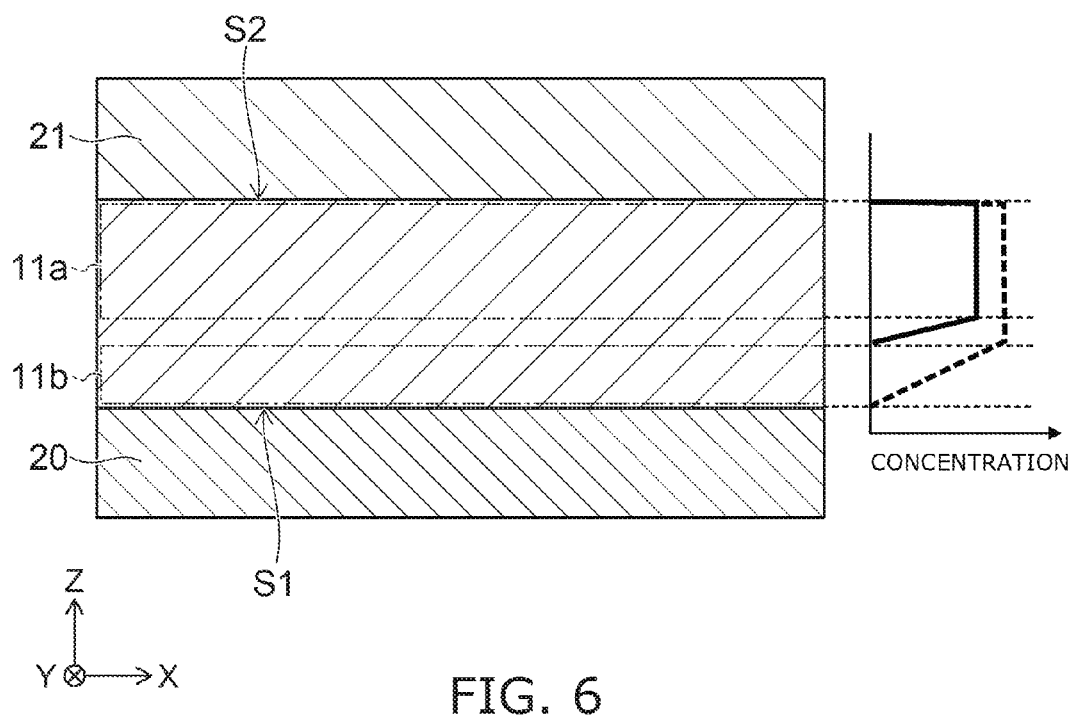

FIG. 6 illustrates the characteristics of the magnetic memory device.

FIG. 6 shows part of the extending portion 11 and an alternative example of the concentration distribution in that part. The figure shown on the left side of FIG. 6 enlarges part of the extending portion 11 in FIG. 1. The figure shown on the right side of FIG. 6 shows an alternative example of the concentration distribution of the first element and the concentration distribution of the second element in the second direction of the extending portion. As shown in FIG. 6, the extending portion 11 may not include the third region 11c shown in FIG. 2.

In the example shown in FIG. 6, the first region 11a is provided between the second region 11b and the second interface S2. The second region 11b is provided between the first region 11a and the first interface S1. As in FIG. 2, the concentration of the first element in the first region 11a is higher than the concentration of the first element in the second region 11b.

That is, in the magnetic memory device shown in FIGS. 2 to 6, the concentration distribution width of the first element and the concentration distribution width of the second element in the second direction of the extending portion 11 are different. The distribution width of the second element is wider than the distribution width of the first element.

Use of the first element in the extending portion 11 can decrease the saturation magnetization in the extending portion 11. This can decrease the current necessary for the movement of the magnetic domain. On the other hand, the first element contained in the extending portion 11 increases pinning sites in the extending portion 11 compared with the case where the extending portion 11 contains no first element. Increase of pinning sites in the extending portion 11 increases the possibility that the movement of the magnetic domain wall is hampered by the pinning site when the magnetic domain wall moves in the extending portion 11. As a result, the shift operation of the magnetic domain wall in the magnetic memory device is made unstable.

The present inventors have discovered that pinning sites are likely to occur near the first interface or near the second interface when the first element exists near the first interface or near the second interface of the extending portion 11.

In this embodiment, the extending portion 11 includes the first region 11a provided between the first interface S1 and the second interface S2, and the second region 11b provided between the first region 11a and the first interface S1. Thus, the occurrence of pinning sites in the extending portion 11 can be reduced. This results in reducing the possibility that the movement of the magnetic domain wall is hampered by the pinning site when the magnetic domain wall moves in the extending portion 11. Thus, the shift operation of the magnetic domain wall in the magnetic memory device 100 can be made stabler. Accordingly, this embodiment provides a magnetic memory device capable of stabler operation while reducing the current necessary for the movement of the magnetic domain.

The cross-sectional shape of the extending portion 11 in the plane crossing the first direction is e.g. a rectangle, square, trapezoid, circle, or ellipse. That is, the outer edge of the cross section of the extending portion 11 in the plane crossing the first direction is a rectangle, square, trapezoid, circle, or ellipse. The width (length in the long side direction of the cross section) of the extending portion 11 is e.g. 0.5 nm or more and 500 nm or less. The thickness (length in the short side direction of the cross section) of the extending portion 11 is e.g. 0.6 nm or more and 100 nm or less. This thickness corresponds to e.g. the shortest distance between the first layer 20 and the second layer 21. The length in the first direction of the extending portion 11 is e.g. 50 nm or more and 100 μm or less. The length of the extending portion 11 may depend on the data capacity of the magnetic memory device 100.

The first layer 20 includes a metal material or a dielectric material. The second layer 21 includes a metal material or a dielectric material. In the case of using a metal material for the first layer 20 and the second layer 21, this metal material includes e.g. at least one element of Ta, W, Ir, Pt, Pd, Cu, Al, Ag, Au, C, Si, Mg, and Hf. In particular, the magnetic domain wall can be efficiently moved in the first magnetic section 10 by using a material including at least one element of Ta, W, Ir, Pt, and Pd. The metal material may include at least one of graphene, tantalum nitride, and tungsten nitride.

In the case of using a dielectric material for the first layer 20 and the second layer 21, the dielectric material includes at least one of magnesium oxide, aluminum oxide, silicon oxide, hafnium oxide, silicon nitride, and aluminum nitride. The first layer 20 and the second layer 21 may include the same material or different materials. The thickness of the first layer 20 is e.g. 0.2 nm or more and 100 nm or less. The thickness of the second layer 21 is e.g. 0.2 nm or more and 100 nm or less.

The read section 40 and the write section 41 can be based on a structure known in the art of this embodiment. The read section 40 can be based on a structure capable of developing e.g. the anomalous Hall effect. The write section 41 may have e.g. a structure for performing magnetic field writing on the extending portion 11.

Figure 7:
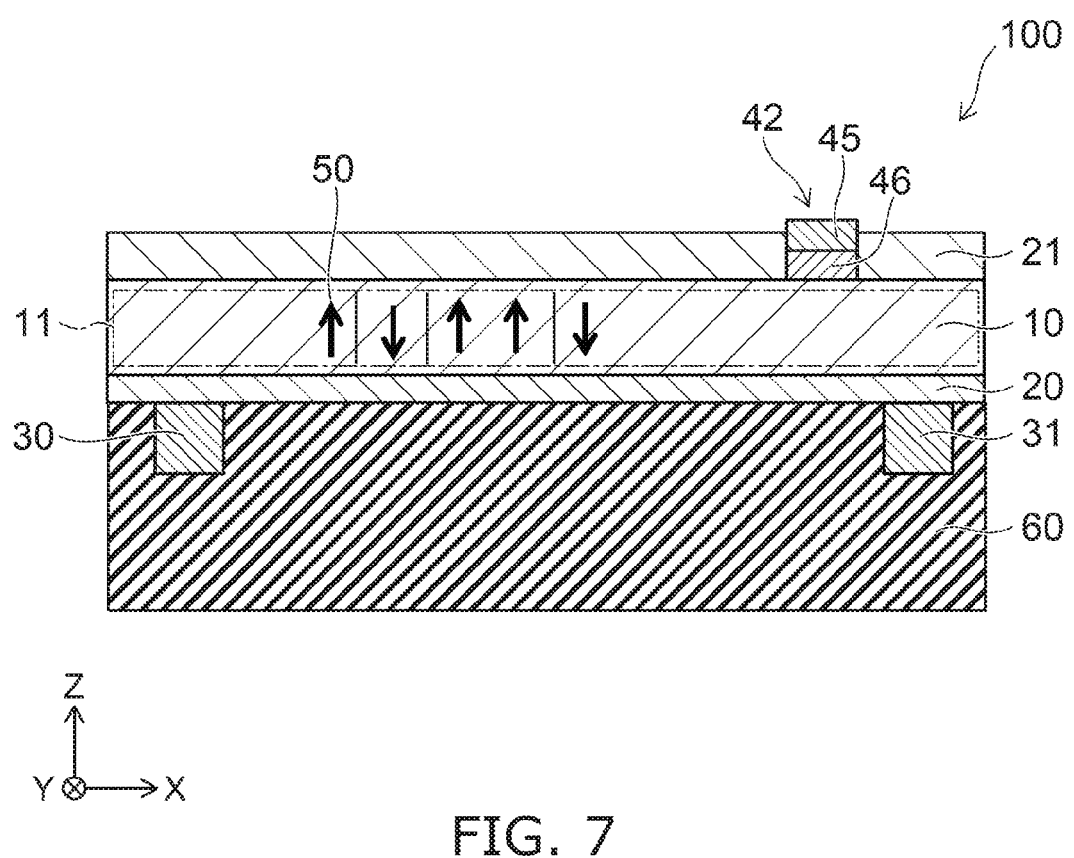
FIG. 7 is a sectional view showing a magnetic memory device 100 according to a first embodiment.

As shown in FIG. 7, the magnetic memory device 100 may include an MTJ (magnetic tunneling junction) 42. The MTJ 42 is composed of e.g. a second magnetic section 45, a first nonmagnetic section 46 provided between the first magnetic section 10 and the second magnetic section 45, and part of the first magnetic section 10. The magnetic anisotropy of the second magnetic section 45 is higher than the magnetic anisotropy of the first magnetic section 10. The second magnetic section 45 functions as what is called a magnetization fixed layer. The first nonmagnetic section 46 can be made of e.g. magnesium oxide. The first nonmagnetic section 46 may be formed entirely on one surface of the first magnetic section 10.

The MTJ 42 may have both the function of the read section 40 and the function of the write section 41. In this case, writing of the magnetic domain is performed on the extending portion 11 by spin injection magnetization reversal through the first nonmagnetic section 46. Reading of the magnetization direction of the magnetic domain in the extending portion 11 is performed by the tunneling magnetoresistance effect through the first nonmagnetic section 46.

Besides, the write section 41 may have a structure capable of developing e.g. a spin orbital torque. The write section 41 may have a structure for writing by e.g. changing the magnetic anisotropy of part of the extending portion 11 by voltage. The read section 40 can also be based on a magnetic sensor.

Next, an example of a method for manufacturing the magnetic memory device 100 according to the first embodiment is described.

Figure 8A:
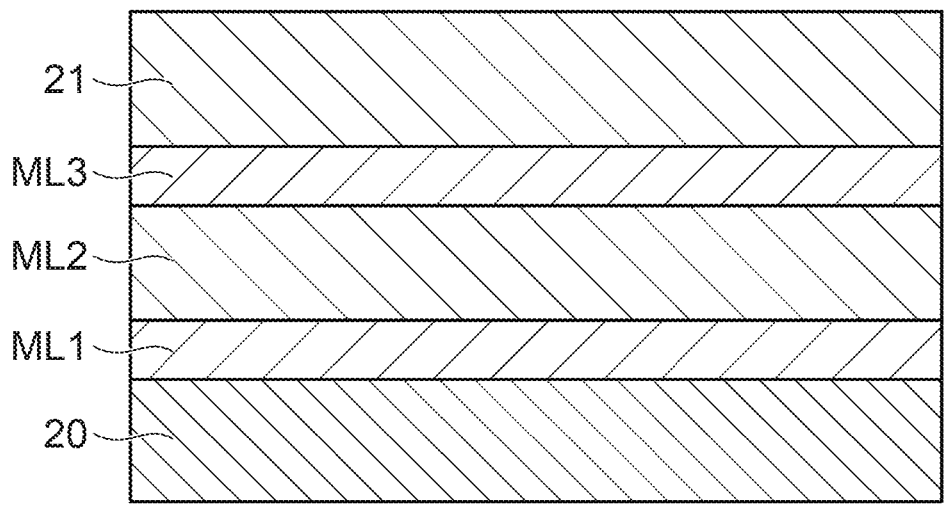
FIGS. 8A and 8B are sectional views showing the process for manufacturing the magnetic memory device 100 according to the first embodiment.
Figure 8B:
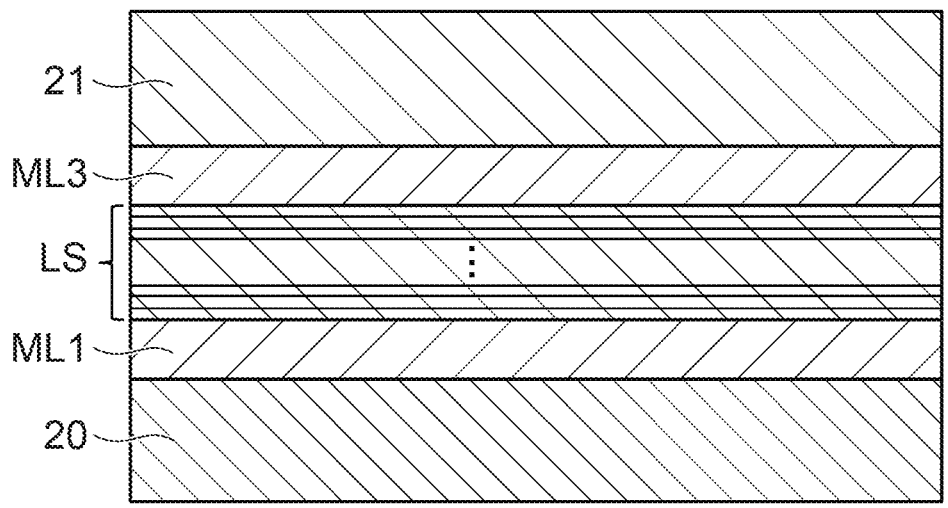

FIGS. 8A and 8B are sectional views showing the process for manufacturing the magnetic memory device 100 according to the first embodiment.

The first magnetic section 10 is formed by e.g. stacking a first magnetic layer ML1, a second magnetic layer ML2, and a third magnetic layer ML3 as shown in FIG. 8A.

For instance, a CoFeB layer having a film thickness of 0.5 nm is formed as a first magnetic layer ML1 on a first layer 20 including TaN. A TbFeCoB layer having a film thickness of 3 nm is formed as a second magnetic layer ML2 on the CoFeB layer. A CoFeB layer having a film thickness of 0.5 nm is formed as a third magnetic layer ML3 on the TbFeCoB layer. A second layer 21 including MgO is formed on these magnetic layers. In this case, the thickness of the first magnetic layer ML1 adjacent to the first layer 20, and the third magnetic layer ML3 adjacent to the second layer 21, is preferably 0.2 nm or more and 10 nm or less.

A magnetic layer containing Tb is formed as the second magnetic layer ML2. A magnetic layer not containing Tb is formed as the first magnetic layer ML1 and the third magnetic layer ML3. Thus, the first magnetic section 10 including an extending portion 11 having the distribution shown in FIG. 2 is formed. That is, the first magnetic layer ML1 corresponds to the second region 11b. The second magnetic layer ML2 corresponds to the first region 11a. The third magnetic layer ML3 corresponds to the third region 11c. The first magnetic layer ML1 and the third magnetic layer ML3 may contain Tb as long as the Tb content of the first magnetic layer ML1 and the Tb content of the third magnetic layer ML3 is less than the Tb content of the second magnetic layer ML2.

Alternatively, only one of the first magnetic layer ML1 and the third magnetic layer ML3 may be formed. This is because providing at least one of the first magnetic layer ML1 and the third magnetic layer ML3 can suppress the occurrence of pinning sites near at least one of the interface between the first layer 20 and the first magnetic section 10 and the interface between the second layer 21 and the first magnetic section 10.

As shown in FIG. 8B, in the first magnetic section 10, a first magnetic layer ML1 may be formed on the first layer 20, and a stacked structure LS may be formed on the first magnetic layer ML1. In this case, for instance, a CoFeB layer of 0.4 nm is formed as a first magnetic layer ML1 on the first layer 20. CoFeB layers and Tb layers are alternately formed, 14 layers for each, on the CoFeB layer to form a stacked structure LS. That is, first element-containing layers containing the first element and second element-containing layers containing the second element are alternately stacked to form a stacked structure LS. A CoFeB layer of 0.4 nm is formed as a third magnetic layer ML3 on the stacked structure LS. Thus, the first magnetic section 10 is formed.

The second element-containing layer may contain the first element as long as the concentration of the first element in the second element-containing layer is lower than the concentration of the first element in the first element-containing layer. The first element-containing layer may contain the second element in addition to the first element.

The first magnetic section 10 may be formed by forming a magnetic layer on the first layer 20 under a film formation condition causing interfacial mixing. In the case of forming a magnetic layer by sputtering technique, such a film formation condition is e.g. to decrease the distance between the target and the substrate, to reduce the gas pressure, and to increase the power for plasma formation. The first element selected from the first group is less likely to migrate than the second element selected from the second group. This can be utilized to suitably set the film formation condition. Thus, the first magnetic section 10 having a structure as shown in one of FIGS. 2 to 5 can be formed.

Figure 9:
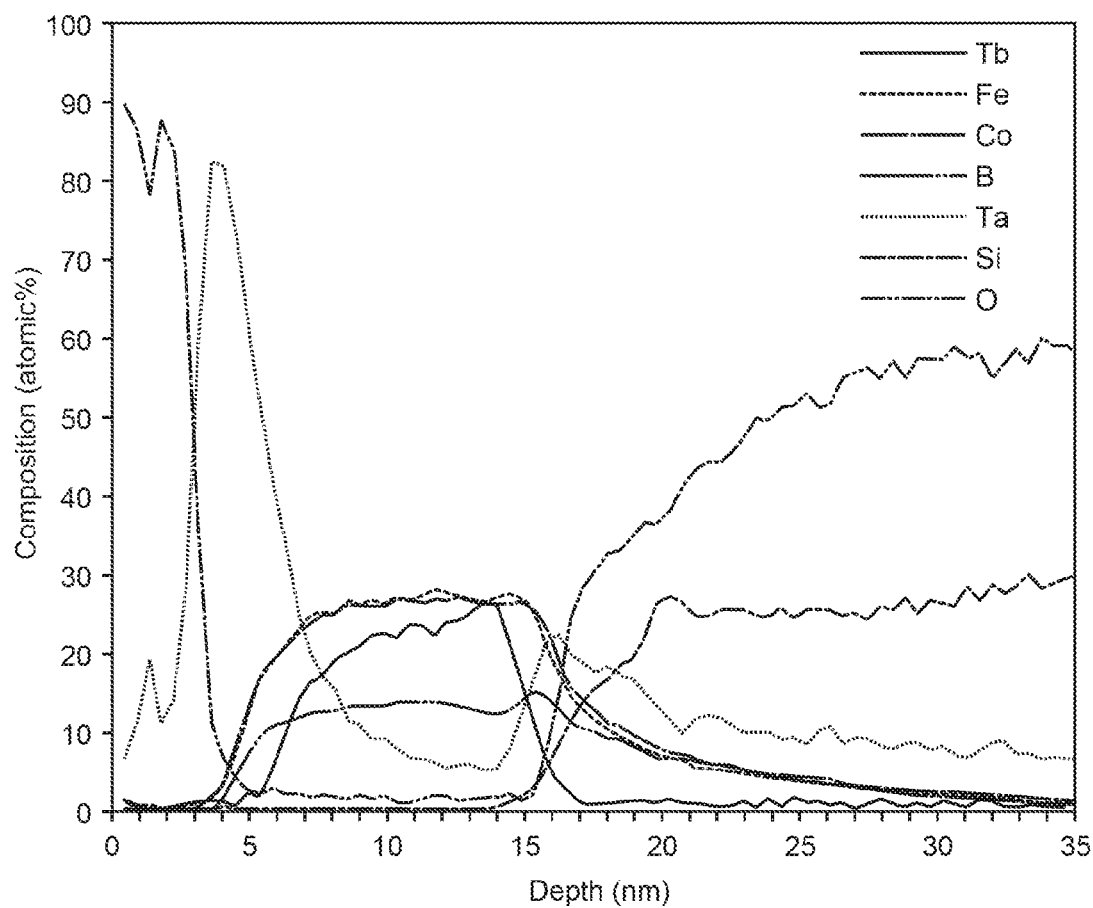
FIG. 9 shows an analysis result of a magnetic film according to a first embodiment.

The concentration of the element contained in each of the first region 11a, the second region 11b, and the third region 11c can be determined by composition analysis in the depth direction. As an example, FIG. 9 shows an analysis result in which a magnetic film formed by causing the aforementioned interfacial mixing is analyzed by glow discharge optical emission spectrometry (GD-OES). The sample is formed as follows. A Ta film of 1 nm corresponding to the first layer 20, a magnetic film of 9 nm including TbFeCoB formed by the aforementioned method, and a Ta film of 3 nm corresponding to the second layer 21 are sequentially formed on a $SiO_2$ substrate.

From the analysis result shown in FIG. 9, it is found that the distribution of Fe and Co is diffused to the Ta peak side compared with the distribution of Tb. Furthermore, it is found that the distribution width of Fe and Co is wider than the distribution width of Tb. It is found that like Fe and Co, B is also diffused more widely than Tb. That is, it is found that there are a region in which the concentration (content) of B is higher than the concentration (content) of Tb, and a region in which the concentration (content) of B is lower than the concentration (content) of Tb. Furthermore, it is found that the region in which the concentration of B is lower than the concentration of Tb is located between the regions in which the concentration of B is higher than the concentration of Tb.

In the analysis result shown in FIG. 9, the region in which the concentration of Tb is higher than the concentration of B corresponds to the first region 11a shown in e.g. FIG. 3. Its adjacent regions in which the concentration of B is higher than the concentration of Tb correspond to the second region 11b and the third region 11c shown in FIG. 3. More specifically, for instance, the regions from the point at which the concentration of Tb falls below the concentration of B to the point at which the concentration of Tb is nearly zero correspond to the second region 11b and the third region 11c. The concentration of Tb in the first region 11a is higher than the concentration of Tb in the second region 11b and the third region 11c. Furthermore, from the analysis result shown in FIG. 9, it is found that the analyzed magnetic film contains Ta as the third element in the portions corresponding to the first region 11a and the third region 11c.

This film was processed by the processing method described later to form the first magnetic section 10. The movement of the magnetic domain wall was examined in the first magnetic section 10. Then, it was confirmed that the magnetic domain wall moves with good reproducibility at a probability of 93% by a current having a current density of 5E6 A/cm$^2$.

As an example of the method for processing this stacked film, a processing method based on sputtering technique and lithography technique is described below. Subsequently, an example of the method for determining the movement of the magnetic domain wall will be described.

A thermal oxidation film is formed on the surface of a silicon substrate using a mask. The silicon substrate is etched to form an opening. A first electrode 30 and a second electrode 31 for passing a current for moving the magnetic domain wall, a wiring (write section 41) for writing a magnetic domain, and an electrode for reading by the anomalous Hall effect are formed in this opening. A Ta film of 1 nm is formed on the substrate in which these electrodes and the wiring are formed. A magnetic film of 9 nm including TbFeCoB is formed on the Ta film by one of the aforementioned methods. Ta of 3 nm is formed on the magnetic film.

The top of Ta of 3 nm is coated with a resist. The multilayer film is processed into a cross shape using an i-line stepper exposure apparatus. Specifically, a portion corresponding to the first magnetic section 10 is formed between the first electrode 30 and the second electrode 31 for passing a current for moving the magnetic domain wall. A wiring (read section 40) for Hall detection is formed so as to cross that portion. The wiring of the write section 41 provided in advance also crosses the first magnetic section 10. A magnetic domain can be written in the first magnetic section 10 by passing a current in this wiring of the write section 41.

The magnetic domain written in the first magnetic section 10 can be shifted to the wiring portion of the read section 40 by passing a pulse-like current in the first magnetic section 10. The movement of the magnetic domain wall can be determined by determining the change of the signal by the Hall effect.

As an alternative method for composition analysis in the depth direction besides GD-OES, for instance, while etching the surface with Ar ions, the etched elements are subjected to mass spectrometry. Thus, the composition distribution in the depth direction can be determined.

Composition analysis can also be performed by combining a transmission electron microscope (TEM) or reflection electron microscope (SEM) with energy dispersive X-ray spectrometry (EDX). For instance, the film is cut to expose a cross section. Then, local composition can be analyzed by EDX while determining the position in the cross section using TEM or SEM.

An MTJ may be used as the read section and the write section as shown in FIG. 7. An example of the method for manufacturing a magnetic memory device in this case is described.

A thermal oxidation film is formed on the surface of a silicon substrate using a mask. The silicon substrate is etched to form an opening. A first electrode 30 and a second electrode 31 for passing a current for moving the magnetic domain wall are formed in this opening. A Pt film and an FeCoB film are formed by sputtering technique. A multilayer film in which Tb and FeCoB are stacked 14 times for each, and an FeCoB film are formed on the FeCoB film. An MgO film is formed on these films. The top of the MgO film is coated with a resist. The stacked film is processed into a narrow wire by an electron beam (EB) writer apparatus to form a first magnetic section 10.

The periphery of the first magnetic section 10 is buried with SiO$_2$. A CoFeB layer and a stacked structure with Co layers and Pd layers provided alternately are formed so as to cover part of the first magnetic section 10 by EB writing and lift-off technique. Thus, a second magnetic section 45 constituting an MTJ is formed. The MTJ is composed of the second magnetic section 45, a first nonmagnetic section 46 adjacent to the second magnetic section 45, and the first magnetic section 10 adjacent to the first nonmagnetic section 46. Thus, writing can be performed by spin injection magnetization reversal through the MgO layer. Reading can be performed by the tunneling magnetoresistance effect through MgO. Accordingly, both the read operation and the write operation can be performed by one device.

Figure 10:
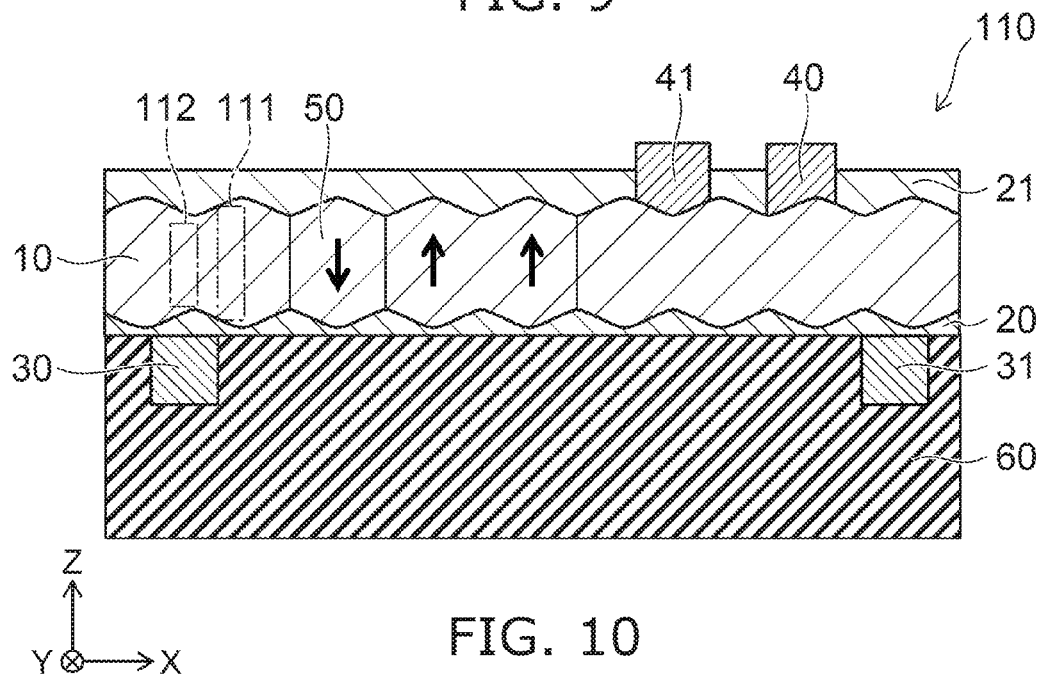
FIG. 10 is a sectional view showing an alternative magnetic memory device 110 according to the first embodiment.

FIG. 10 is a sectional view showing an alternative magnetic memory device 110 according to the first embodiment.

The magnetic memory device 110 is different from the magnetic memory device 100 in e.g. the structure of the first magnetic section 10. The structure of the magnetic memory device 110 except the first magnetic section 10 can be based on a structure similar to that of e.g. the magnetic memory device 100.

The extending portion 11 of the first magnetic section 10 includes a first portion 111 having a relatively thick thickness in the second direction, and a second portion 112 having a relatively thin thickness in the second direction. That is, the distance between one end in the second direction of the first portion 111 and the other end in the second direction of the first portion 111 is larger than the distance between one end in the second direction of the second portion 112 and the other end in the second direction of the second portion 112. The extending portion 11 includes a plurality of first portions 111 and a plurality of second portions 112. The first portions 111 and the second portions 112 are arranged alternately in the first direction.

In the portion in which the distance from one end to the other end in the second direction is small, its perimeter is short. The magnetic domain wall can exist at lower energy in the portion having a short perimeter than in the portion having a long perimeter. Thus, even if there are variations in the shift amount of the magnetic domain walls, the magnetic domain wall stably remains in the first portion 111 in which the distance from one end to the other end in the second direction is small. The magnetic domain walls remaining stably also stabilize the region holding the magnetic domains. This can reduce the possibility of shift error of the magnetic domain wall when the magnetic domain wall moves in the extending portion 11.

Second Embodiment

Figure 11:
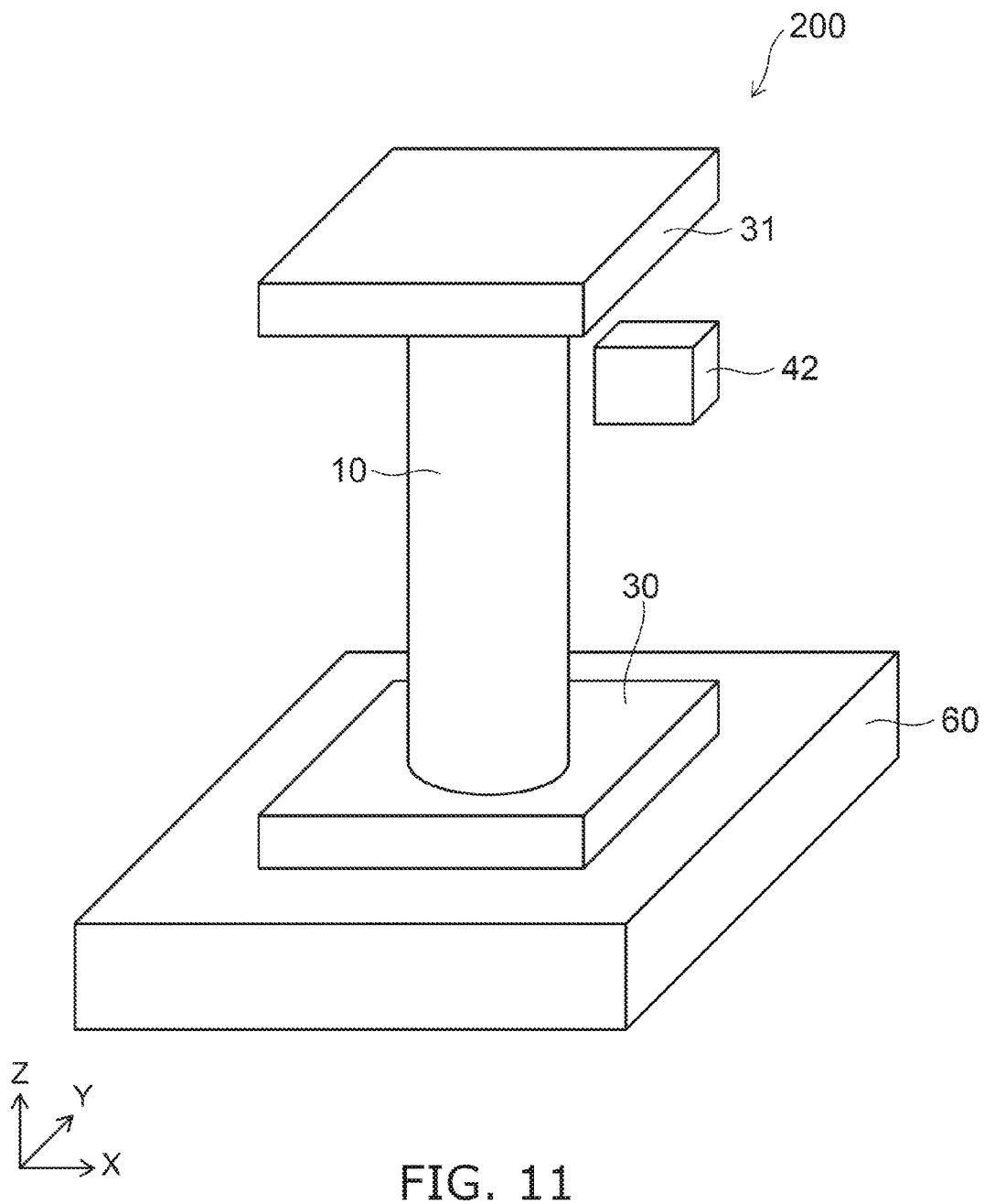
FIG. 11 is a perspective view showing a magnetic memory device 200 according to a second embodiment.

FIG. 11 is a perspective view showing a magnetic memory device 200 according to a second embodiment.

Figure 12A:
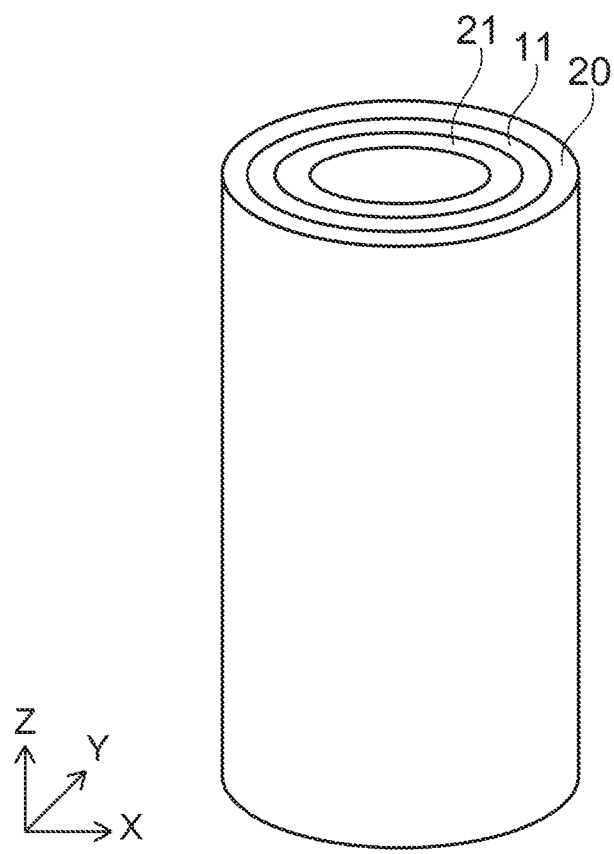
FIGS. 12A and 12B are partial enlarged views of the magnetic memory device 200 according to the second embodiment.
Figure 12B:
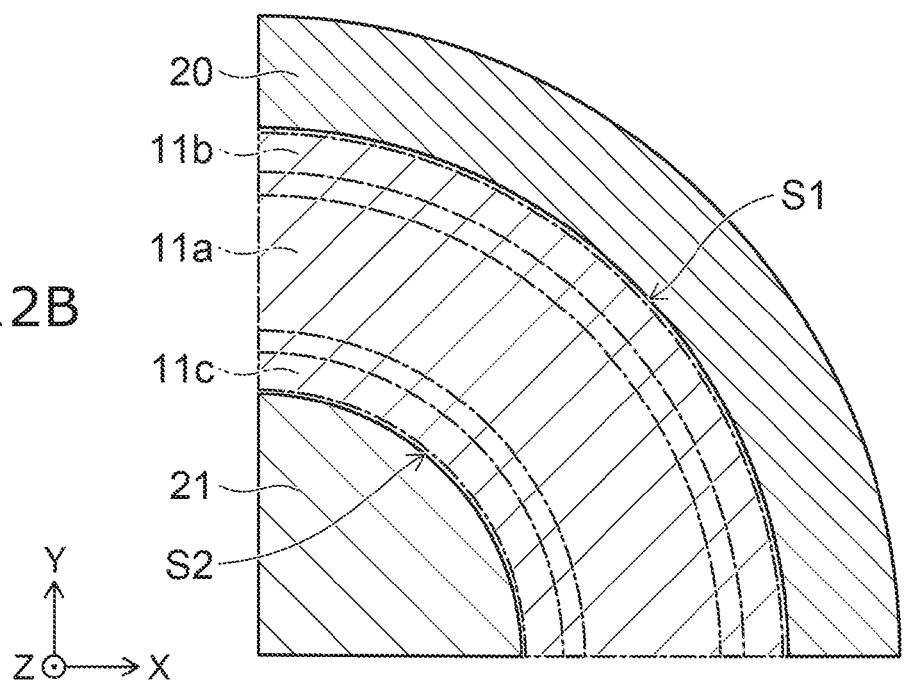

FIGS. 12A and 12B are partial enlarged views of the magnetic memory device 200 according to the second embodiment.

As shown in FIG. 11, in the magnetic memory device 200, the first magnetic section 10 includes a cylindrical extending portion 11 extending in a first direction. Although not shown in FIG. 11, a first layer 20 and a second layer 21 extend in the first direction. The extending portion 11 is provided around the second layer 21 in a second direction crossing the first direction. The first layer 20 is provided around the extending portion 11. That is, the cross-sectional shape of the extending portion 11 in the plane parallel to the surface of the substrate 60 is e.g. a doughnut shape. In other words, the cross-sectional shape of the extending portion 11 in the plane parallel to the surface of the substrate 60 is e.g. an annulus having an annular first interface S1 and an annular second interface S2. In this case, the outer edge of the cross section of the extending portion 11 is circular.

The magnetic memory device 200 may not include the second layer 21, and the cross-sectional shape of the extending portion 11 may be a rectangle, trapezoid, ellipse, or polygon. Alternatively, the extending portion 11 may be provided around the second layer 21, and the outer edge of the cross section of the extending portion 11 may be a rectangle, trapezoid, ellipse, or polygon.

The magnetic memory device 200 is provided on e.g. the substrate 60. The extending portion 11 extends in a direction crossing the surface of the substrate 60. The first magnetic section 10 may include, besides the extending portion 11, a portion spreading in e.g. a plane crossing the first direction. The first direction is e.g. the Z-direction shown in FIG. 11.

One end in the first direction of the extending portion 11 is connected to a first electrode 30. The other end in the first direction of the extending portion 11 is connected to a second electrode 31. The first electrode 30 and the second electrode 31 may be provided around part of the extending portion 11 in a plane crossing the first direction. The structure and arrangement of the first electrode 30 and the second electrode 31 are not limited to the configuration shown in FIG. 11 as long as a current can be passed between the first electrode 30 and the second electrode 31 through the extending portion 11.

The magnetic memory device 200 includes e.g. an MTJ 42 as a read section and a write section. The MTJ 42 is aligned with e.g. part of the extending portion 11 in the second direction crossing the first direction. The MTJ 42 may be aligned with the extending portion 11 in the first direction. Instead of the MTJ 42, the magnetic memory device 200 may include the read section 40 and the write section 41 described in the first embodiment. The second direction is e.g. the X-direction or the Y-direction shown in FIG. 11, or a direction including both an X-direction component and a Y-direction component.

As shown in FIG. 12A, the extending portion 11 is provided around the second layer 21 in the second direction crossing the first direction. The first layer 20 is provided around the extending portion 11 in the second direction. The inside of the extending portion 11 may be buried with the second layer 21. Alternatively, another layer may be provided inside the second layer 21. The second layer 21 preferably includes a dielectric material. In the case where the second layer 21 includes a dielectric material, a layer including a metal material may be provided inside the second layer 21.

The material of the components included in the magnetic memory device 200 can be based on the material of the components described in the first embodiment.

As shown in FIG. 12B, the extending portion 11 includes a first region 11a, a second region 11b, and a third region 11c. The third region 11c is located around the second layer 21 in the second direction. The first region 11a is located around the third region 11c in the second direction. The second region 11b is located around the first region 11a in the second direction. The extending portion 11 has a first interface S1 and a second interface S2. The first interface S1 and the second interface S2 are e.g. cylindrical surfaces.

As in the first embodiment, the first region 11a contains the first element. The second region 11b and the third region 11c contain the second element. The concentration of the first element in the first region 11a is higher than the concentration of the first element in the second region 11b and the third region 11c. The extending portion 11 may include only the first region 11a and the second region 11b without including the third region 11c. Alternatively, the extending portion 11 may include only the first region 11a and the third region 11c without including the second region 11b.

Next, an example of a method for manufacturing the magnetic memory device 200 according to the second embodiment is described.

FIGS. 13A to 15B are process sectional views showing the process for manufacturing the magnetic memory device 200.

In the following, an example of the manufacturing method is described in the case where an arrangement of holes is fabricated by a wet etching process based on anodization technique. In the manufacturing method described below, a dry etching process may be used instead of the wet etching process.

Figure 13A:
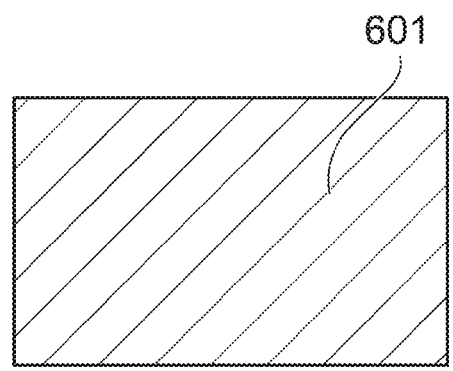
FIGS. 13A to 15B are process sectional views showing the process for manufacturing the magnetic memory device 200.

As shown in FIG. 13A, a base material 601 of a metal such as aluminum is prepared.

The base material 601 is used as an anode and energized in an electrolyte solution (such as sulfuric acid, oxalic acid, or phosphoric acid). At this time, the anode metal is oxidized and dissolved as metal ions. This metal ion is combined with oxygen in the liquid to produce a metal oxide. The metal oxide remains and grows on the anode metal surface. Thus, an oxide (alumina) 602 grows on the base material 601. At this time, dissolution and growth proceed simultaneously. Thus, fine holes provided in the alumina are arranged in the aluminum surface of the anode. The dimension of this hole varies with e.g. the purity of aluminum of the base material 601, the voltage applied to the base material 601 during anodization, the kind of the electrolyte solution, and the processing time of anodization.

Figure 13B:
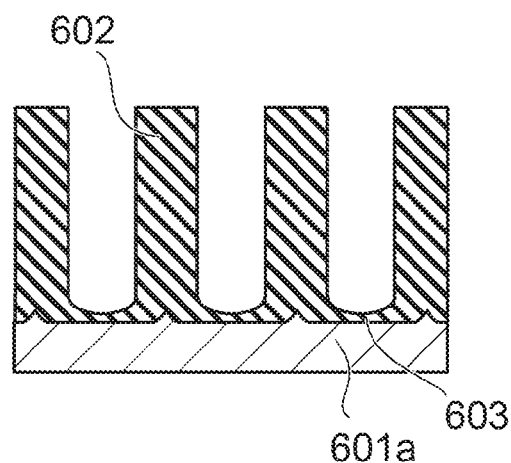
Figure 13C:
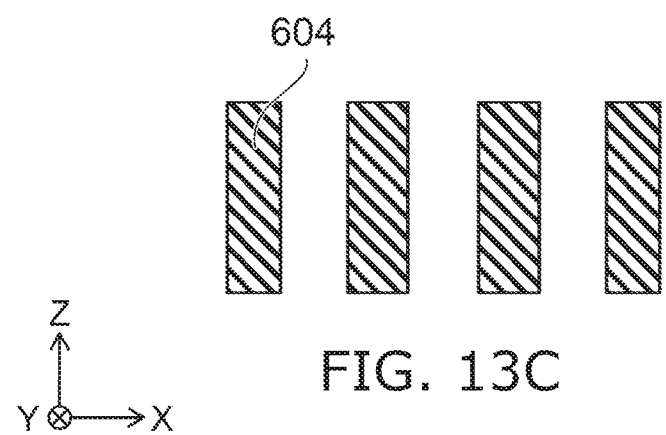

At the time of anodization, a barrier layer 603 is formed on the unreacted base material 601 as shown in FIG. 13B. Thus, the hole formed by anodization is less likely to penetrate through the base material. Accordingly, for the anodized base material, the unreacted base material 601a is dissolved with e.g. an iodine-methanol solution and peeled from the oxide 602. The barrier layer 603 is dissolved with strong acid. Thus, an insulating member 604 including a plurality of through holes is obtained as shown in FIG. 13C. A planarization treatment such as CMP (chemical mechanical polishing) treatment may be performed to planarize the surface of the insulating member 604. This planarization treatment may be performed after forming the magnetic material described later.

Figure 14A:
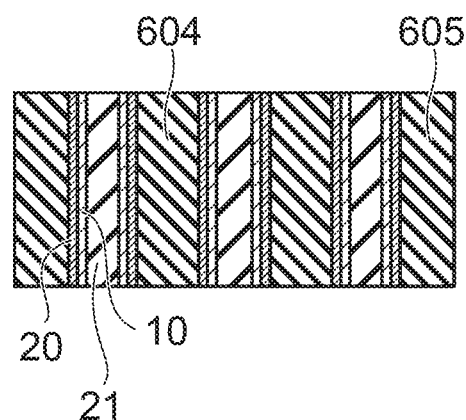
Figure 14B:
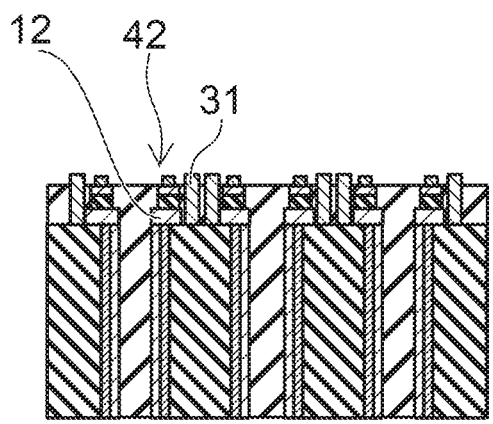

As shown in FIG. 14A, a first layer 20, a first magnetic section 10, and a second layer 21 are formed by e.g. CVD (chemical vapor deposition) technique on the arrangement of through holes formed by anodization. The first layer 20, the first magnetic section 10, and the second layer 21 may be formed by sputtering technique or evaporation technique. The first magnetic section 10 is formed by a method similar to the method described in the first embodiment. The surface portion of the through hole inner wall of the insulating member 604 may be used as the first layer 20. That is, the first magnetic section 10 may be formed directly on the inner wall of the through hole without forming the first layer 20.

The fabricated magnetic sections in the arrangement need to be electrically insulated from each other. In this respect, alumina is preferable because it is an insulator. The anodization technique can be performed also using hydrofluoric acid as an electrolyte solution and a silicon substrate as a base material. In this case, an arrangement of holes is fabricated in silicon oxide. In the case of using a silicon substrate, through holes can also be formed directly in a silicon substrate provided with semiconductor devices such as transistors.

Thus, a magnetic material is formed on the inner wall of the through hole of the insulating member 604. Accordingly, a structural body 605 including an arrangement of first magnetic sections 10 is fabricated. In this embodiment, a magnetic layer 12 is formed at one end in the first direction of the extending portion 11. As viewed in the first direction, part of the magnetic layer 12 overlaps the extending portion 11, and another part of the magnetic layer 12 is provided around the extending portion 11. An MTJ 42 is formed on the magnetic layer 12. A second electrode 31 is formed at the end part of the magnetic layer 12 on the opposite side from the end part connected to the extending portion 11. These are fabricated by e.g. lithography process on the structural body 605. The MTJ may be composed of part of the extending portion 11, a first nonmagnetic section 46, and a second magnetic section 45.

Figure 15A:
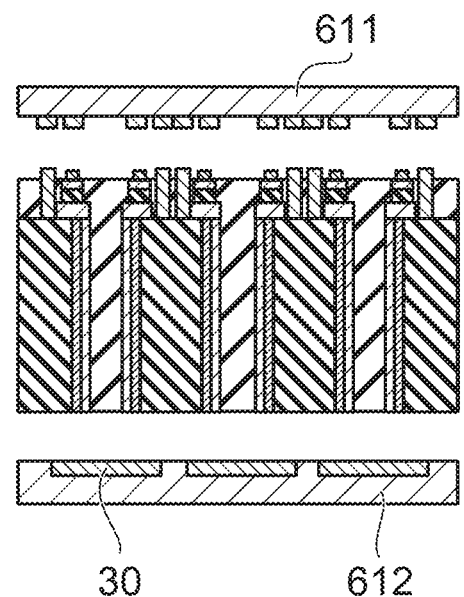

For instance, as shown in FIG. 15A, a substrate 611 provided with wirings and transistors is laminated and bonded to the upper surface of the structural body 605. Likewise, a substrate 612 provided with a first electrode 30 is laminated and bonded to the lower surface of the structural body 605.

Figure 15B:
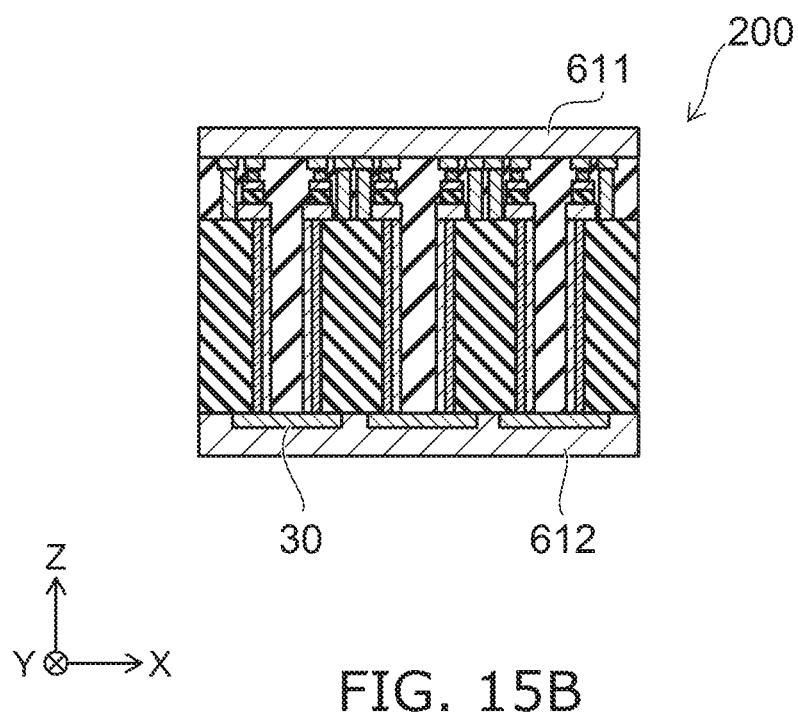

By the above process, the magnetic memory device 200 according to this embodiment as shown in FIG. 15B is obtained. In the magnetic memory device 200 shown in FIG. 15B, writing of a magnetic domain and reading of the magnetization direction of a magnetic domain are performed in the magnetic layer 12 connected to the extending portion 11. When a current is passed between the first electrode 30 and the second electrode 31, the magnetic domain wall can move between the extending portion 11 and the magnetic layer 12.

Alternatively, the magnetic memory device 200 according to this embodiment may be fabricated by the following method. A first electrode 30 is formed on a substrate 60. A stacked structure of a first insulating layer, a magnetic layer, and a second insulating layer is formed on the substrate 60. Holes are formed in this stacked structure by e.g. photolithography technique and RIE (reactive ion etching) technique. This hole is formed at the position provided with the first electrode 30. This hole penetrates through the first insulating layer, the ferromagnetic layer, and the second insulating layer in the stacking direction thereof.

A first layer 20, an extending portion 11, and a second layer 21 are formed inside the hole. In this case, the first layer 20 is made of e.g. magnesium oxide. The second layer is made of e.g. silicon oxide. Part of the extending portion 11, part of the first layer 20, and the magnetic layer between the first insulating layer and the second insulating layer constitute an MTJ. By this MTJ, reading and writing of a magnetic domain are performed on the extending portion 11. After the first layer 20, the extending portion 11, and the second layer 21 are formed, the surface of the second insulating layer is polished, and a second electrode 31 is formed. Thus, the magnetic memory device 200 according to this embodiment is obtained.

In the magnetic memory device 200 according to this embodiment, as in the magnetic memory device 100 according to the first embodiment, the occurrence of pinning sites in the extending portion 11 can be reduced. As a result, the shift operation of the magnetic domain wall in the magnetic memory device 200 can be made stabler.

The magnetic memory device 200 according to this embodiment includes an extending portion 11 extending in the first direction crossing the surface of the substrate 60. This can increase the recording density per unit area of the substrate 60.

Figure 16:
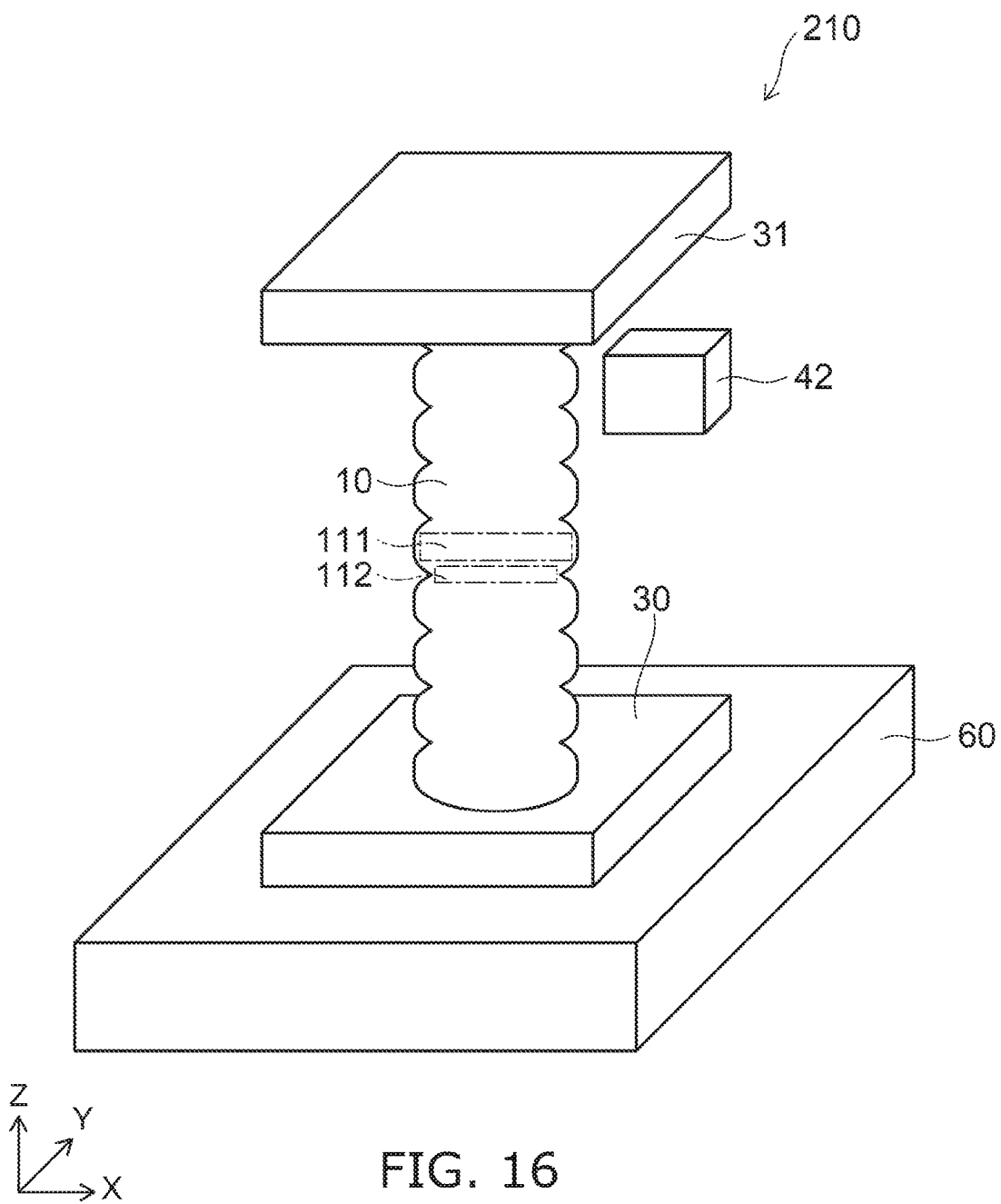
FIG. 16 is a sectional view showing an alternative magnetic memory device 210 according to the second embodiment.

FIG. 16 is a sectional view showing an alternative magnetic memory device 210 according to the second embodiment.

The magnetic memory device 210 is different from the magnetic memory device 200 in e.g. the structure of the first magnetic section 10. The structure of the magnetic memory device 210 except the first magnetic section 10 can be based on a structure similar to that of e.g. the magnetic memory device 200.

The extending portion 11 includes a plurality of first portions 111 and a plurality of second portions 112. The distance between one end in the second direction of the first portion 111 and the other end in the second direction of the first portion 111 is larger than the distance between one end in the second direction of the second portion 112 and the other end in the second direction of the second portion 112. The extending portion 11 includes a plurality of first portions 111 and a plurality of second portions 112. The first portions 111 and the second portions 112 are arranged alternately in the first direction.

Likewise, the first layer 20 and the second layer 21 may also alternately include portions having a relatively large distance and portions having a relatively small distance between one end and the other end in the second direction.

The magnetic section 10 in the magnetic memory device 210 can be fabricated by e.g. the following method.

In the step shown in FIG. 13B, when the base material 601 is anodized, the voltage applied to the base material 601 is periodically changed. Thus, the diameter of the hole formed in the base material 601 can be periodically changed in the depth direction (first direction). That is, while a high voltage is applied, anodization rapidly proceeds in the depth direction. Thus, a portion having a small dimension in the X-direction and the Y-direction is formed. Accordingly, the portion formed under application of high voltage has a relatively small dimension. The portion formed under application of low voltage has a relatively large dimension.

In the step shown in FIG. 14A, a magnetic film is formed on the inner wall of the hole with the diameter changed periodically in the first direction. This can form an extending portion 11 including a plurality of first portions 111 and a plurality of second portions 112. For instance, on the portion having a relatively large diameter, the first portion 111 having a relatively large distance between one end and the other end in the second direction is formed. On the portion having a relatively small diameter, the second portion 112 having a relatively small distance between one end and the other end in the second direction is formed.

Subsequently, steps similar to the steps shown in FIGS. 14B to 15B are performed. Thus, the magnetic memory device 210 is obtained.

The magnetic memory device 210 shown in FIG. 16 can reduce the possibility of shift error of the magnetic domain wall when the magnetic domain wall moves in the extending portion 11.

Third Embodiment

Figure 17:
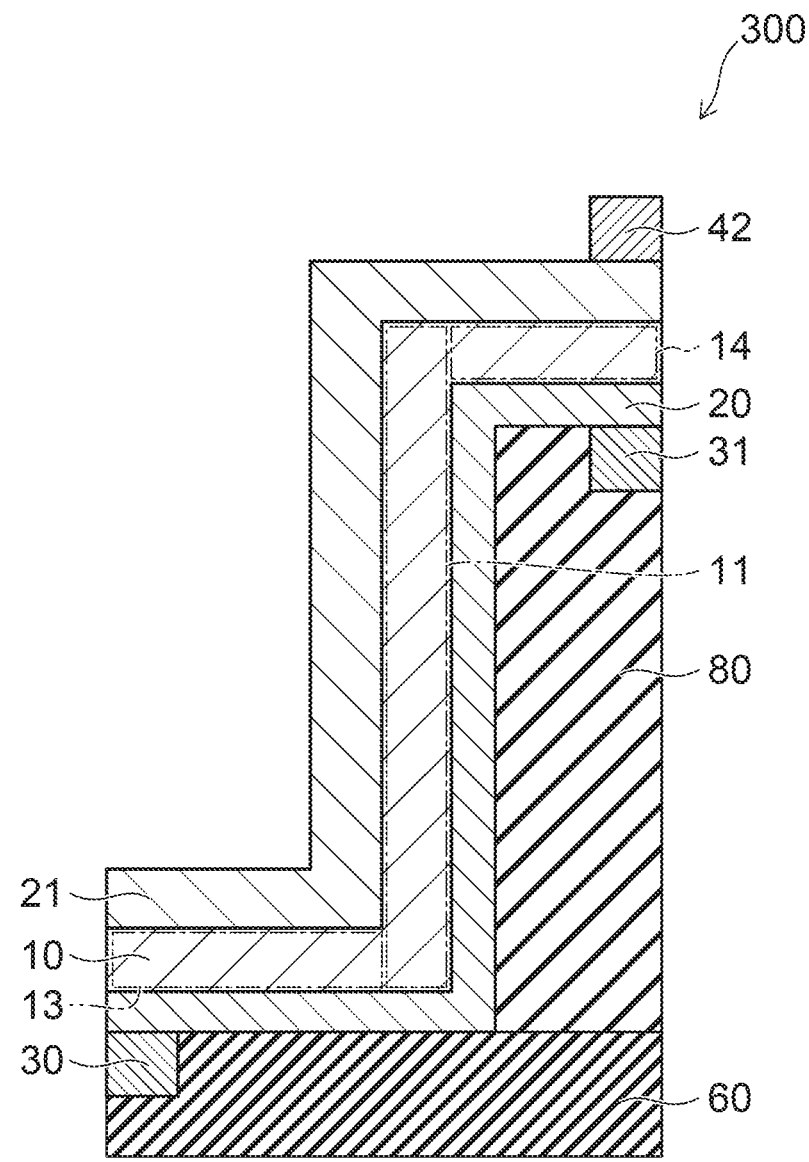
FIG. 17 is a sectional view of a magnetic memory device 300 according to a third embodiment.

FIG. 17 is a sectional view of a magnetic memory device 300 according to a third embodiment.

Figure 18:
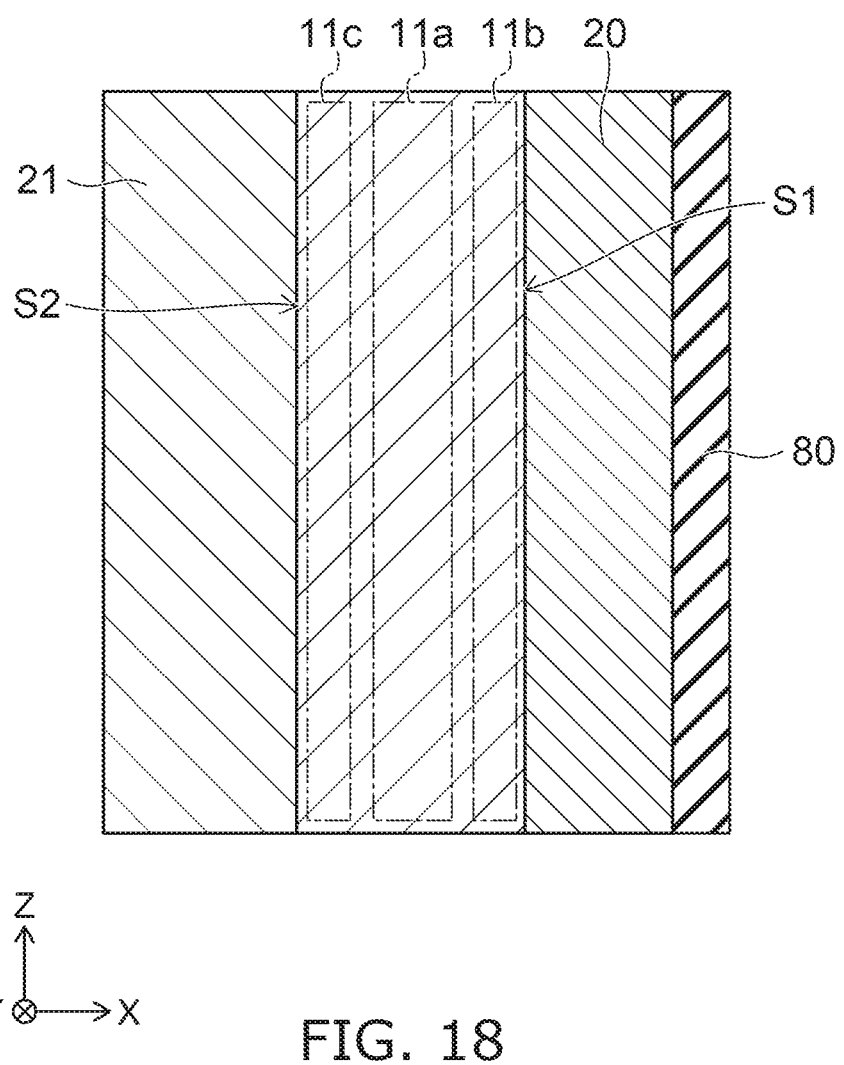
FIG. 18 is a partial enlarged view of the magnetic memory device 300 according to the third embodiment.

FIG. 18 is a partial enlarged view of the magnetic memory device 300 according to the third embodiment.

As shown in FIG. 17, the first magnetic section 10 includes a extending portion 11 extending in a first direction, a third portion 13, and a fourth portion 14. The third portion 13 and the fourth portion 14 extend in a second direction crossing the first direction. The third portion 13 and the fourth portion 14 may spread in the second direction. The first direction is e.g. the Z-direction shown in FIG. 17. The second direction is e.g. the X-direction shown in FIG. 17.

The third portion 13 and the fourth portion 14 may include e.g. a magnetic domain with the magnetization direction along the second direction. Alternatively, the third portion 13 and the fourth portion 14 may include a magnetic domain with the magnetization direction along the first direction. The third portion 13 and the fourth portion 14 may include a single magnetic domain, or a plurality of magnetic domains in the second direction.

As shown in FIG. 18, the extending portion 11 includes a first region 11a, a second region 11b, and a third region 11c. The extending portion 11 has a first interface S1 and a second interface S2. The first interface S1 is e.g. an interface between the extending portion 11 and the first layer 20. The first interface S1 may be an interface between the first magnetic section 10 and an insulating section 80. The second interface S2 is e.g. an interface between the extending portion 11 and the second layer 21.

The first electrode 30 is connected to the third portion 13. The second electrode 31 is connected to the fourth portion 14. That is, the extending portion 11 is connected to the first electrode 30 and the second electrode 31 through the third portion 13 and the fourth portion 14.

An insulating section 80 is provided on the substrate 60. At least part of the third portion 13 of the first magnetic section 10 is provided between the substrate 60 and the second layer 21 in the first direction. At least part of the extending portion 11 is provided between the second layer 21 and the insulating section 80 in the second direction. The fourth portion 14 is provided between the second layer 21 and the insulating section 80 in the first direction. Part of the first layer 20 is provided between the first magnetic section 10 and the substrate 60 in the first direction. Another part of the first layer 20 is provided between the first magnetic section 10 and the insulating section 80 in the second direction. Still another part of the first layer 20 is provided between the first magnetic section 10 and the insulating section 80 in the first direction.

The first electrode 30 is provided e.g. between the substrate 60 and the third portion 13. The second electrode 31 is provided e.g. between the insulating section 80 and the fourth portion 14. Part of the fourth portion 14 is provided e.g. between the MTJ 42 and the insulating section 80. The magnetic memory device 300 may include a read section 40 and a write section 41 instead of the MTJ 42.

The material of the components included in the magnetic memory device 300 can be based on the material of the components described in the first embodiment.

FIGS. 19A to 22B are process views showing the process for manufacturing the magnetic memory device 300 according to the third embodiment.

Figure 19A:
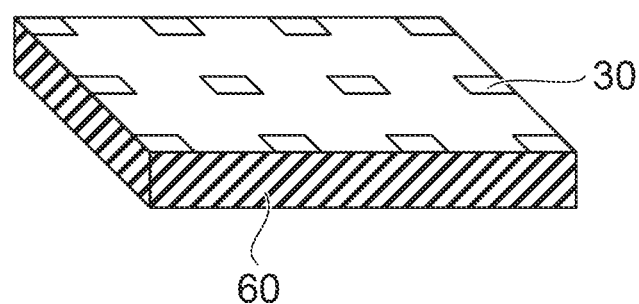
FIGS. 19A to 22B are process views showing the process for manufacturing the magnetic memory device 300 according to the third embodiment.

As shown in FIG. 19A, a first electrode 30 is formed on a substrate 60 provided with a structure necessary for memory operation such as transistors and wirings. For instance, the first electrode 30 is formed in a plurality in the X-direction and the Y-direction on the substrate 60.

An insulating section 80a is formed on a plurality of first electrodes 30. A preferable method for forming the insulating section 80a is PVD technique such as evaporation technique and sputtering technique having rapid film formation rate. However, CVD technique or ALD technique can also be used. The material of the insulating section 80a can be e.g. $SiO_2$, $SiN$, or $Al_2O_3$.

Figure 19B:
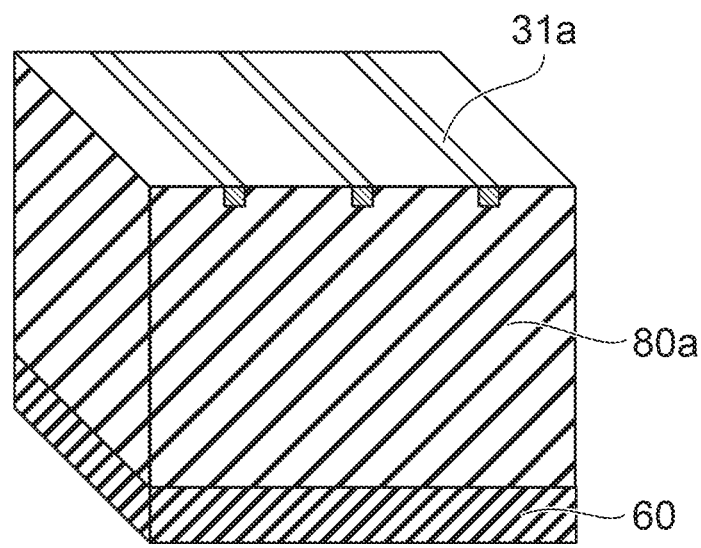

For instance, the surface of the insulating section 80a is processed by RIE technique using a resist mask with a line-and-space pattern in the X-direction. Thus, an opening extending in the Y-direction is formed. A metal layer is formed on the surface of the insulating section 80a. The excess metal material deposited on other than the inside of the opening is removed by e.g. CMP technique. By this step, a second electrode 31a buried in the surface of the insulating section 80 is formed. FIG. 19B shows the state at this time.

The second electrode 31a may be formed without forming an opening in the insulating section 80a. Instead, a metal layer may be formed on the surface of the insulating section 80a and patterned.

Figure 19C:
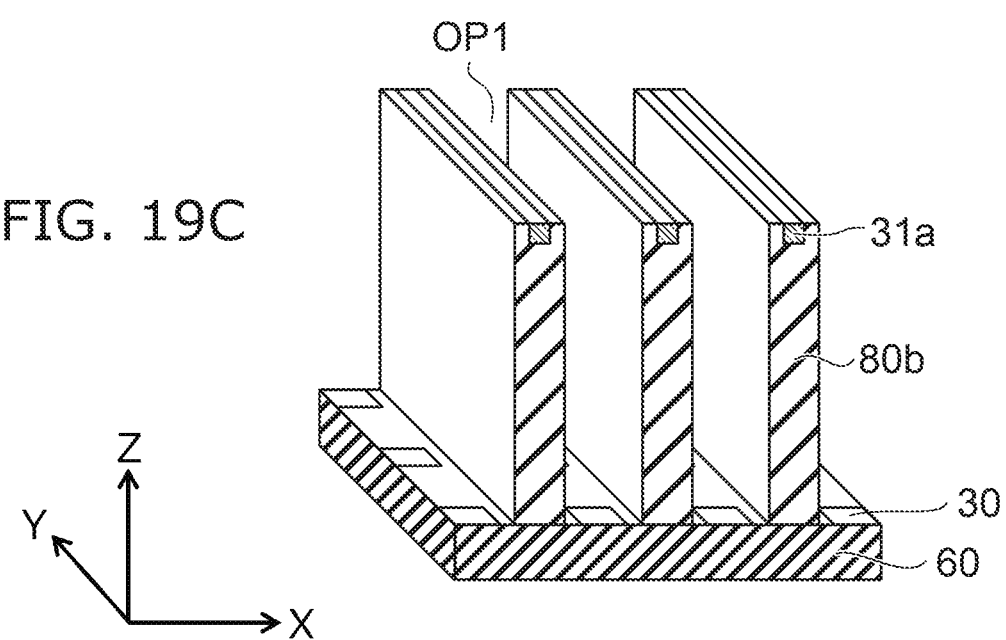

As shown in FIG. 19C, an opening OP1 extending in the Y-direction is formed in the region of the insulating section 80a not provided with the second electrode 31a. For instance, the insulating section 80a is processed by RIE technique using a resist mask with a line-and-space pattern in the X-direction. Thus, the opening OP1 is formed.

By this step, the first electrode 30 is exposed. Furthermore, by this step, a plurality of insulating sections 80b separated from each other in the X-direction are formed. At this time, as an example, the second electrode 31a is located between the first electrodes 30 adjacent to each other in the X-direction in plan view. Here, the plan view means e.g. a view as viewed in the direction (Z-direction) perpendicular to the surface of the substrate.

Figure 20A:
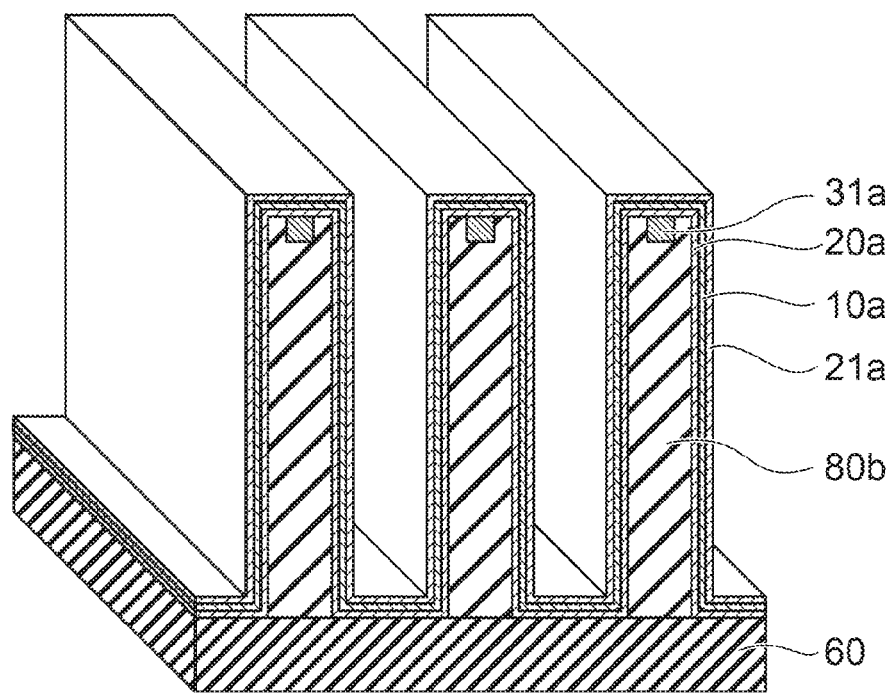

A first magnetic section 10a is formed on the first electrode 30, on the insulating section 80b, and on the second electrode 31a. As shown in FIG. 20A, a first layer 20a may be formed on the first electrode 30, on the insulating section 80b, and on the second electrode 31a. The first magnetic section 10a may be formed on the first layer 20a. A second layer 21a may be formed on the first magnetic section 10a. The first magnetic section 10a is formed by e.g. CVD technique or ALD technique. The CVD technique and ALD (atomic layer deposition) technique use a precursor including one or more elements contained in the material of each layer. Formation of an alloy layer uses a plurality of precursors.

Figure 20B:
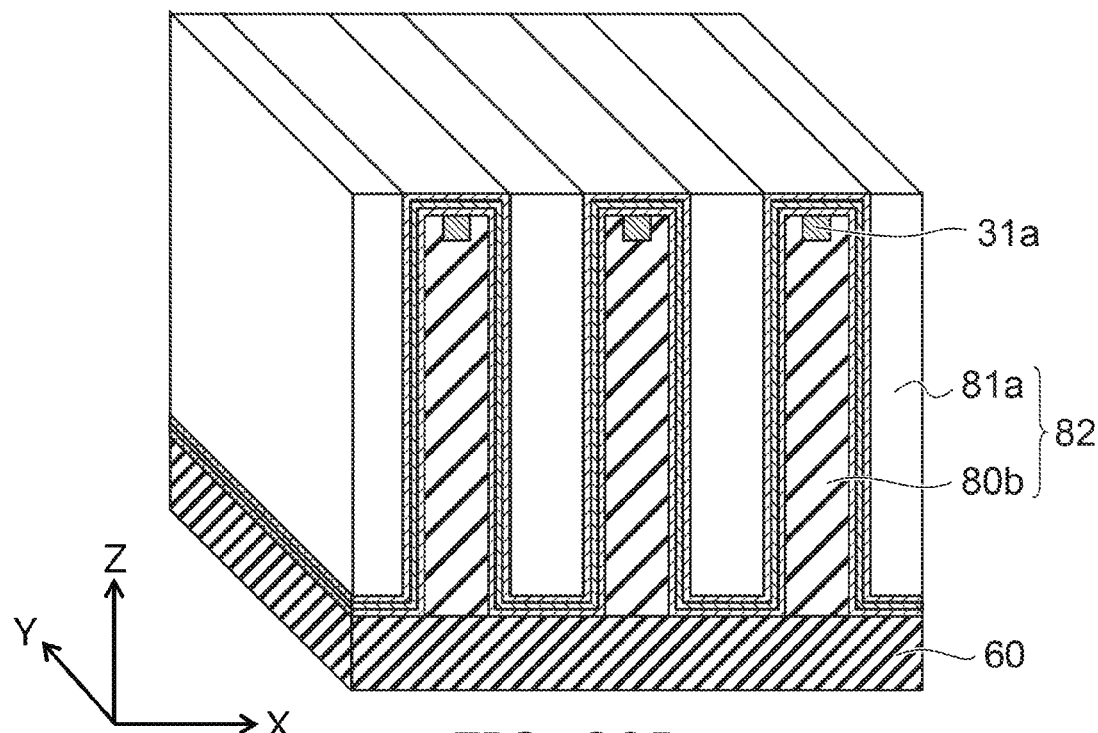

As shown in FIG. 20B, an insulating section 81a is formed on the second layer 21a. Thus, the first opening OP1 is buried. Formation of the insulating section 81a can use a method similar to the formation of the insulating section 80a. The material of the insulating section 81a can be a material similar to that of the insulating section 80a.

After the first opening OP1 is buried, an excess insulating material, if any, on the surface may be removed by a method such as CMP technique to planarize the surface. At this time, at least part of the first magnetic section 10a, at least part of the first layer 20a, and at least part of the second layer 21a have a structure buried in a first insulating structural body 82 made of the insulating section 80b and the insulating section 81a.

Figure 21A:
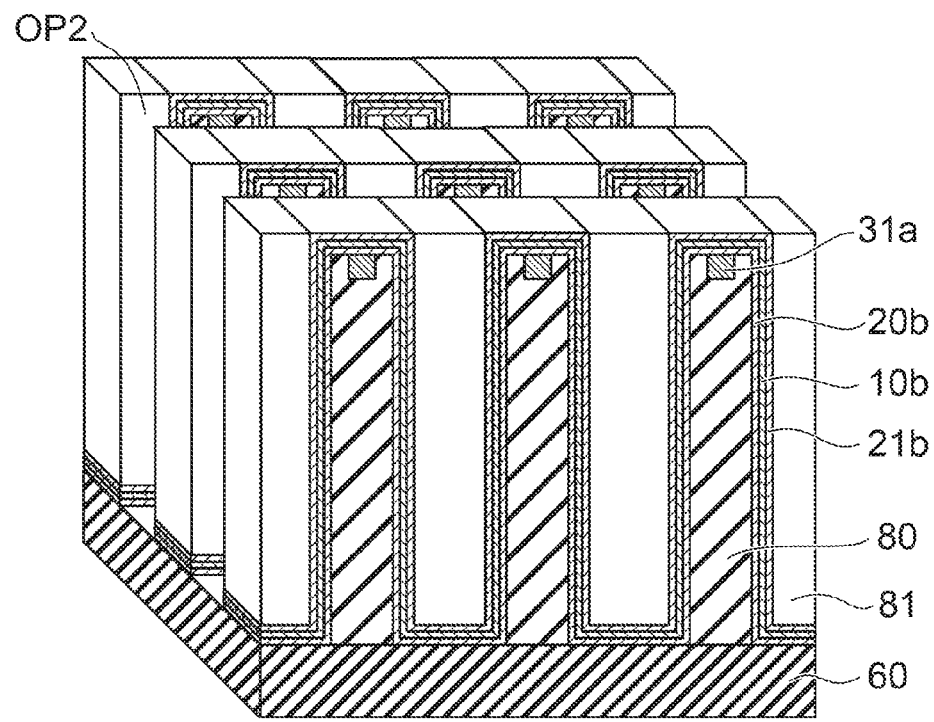

As shown in FIG. 21A, a second opening OP2 extending in the X-direction is formed in the first insulating structural body 82 made of the insulating section 80b and the insulating section 81a. For instance, the first insulating structural body 82 is processed by RIE technique using a resist mask with a line-and-space pattern in the Y-direction. Thus, the second opening OP2 is formed. At this time, the first insulating structural body 82 is processed until the substrate 60 is exposed. The resist mask is formed on the first insulating structural body 82 so that the first electrode 30 is not exposed when the opening OP2 is formed by processing the first insulating structural body 82. Specifically, the resist mask is formed at a position not overlapping the first electrode 30 in plan view.

By this step, the first magnetic section 10a is separated into a plurality in the Y-direction to form first magnetic sections 10b. Likewise, the first layer 20a, the second electrode 31a, and the second layer 21a are separated into a plurality in the Y-direction to form first layers 20b, second electrodes 31, and second layers 21b. Furthermore, by this step, a plurality of insulating sections 80 and a plurality of insulating sections 81 separated from each other in the Y-direction are formed.

Figure 21B:
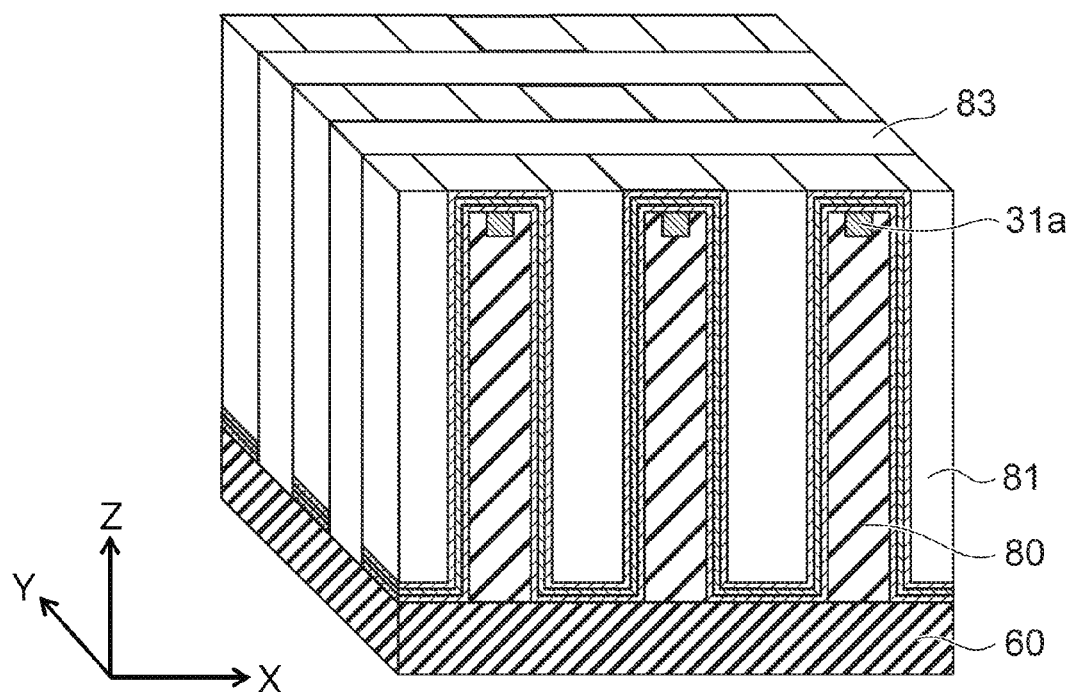

Next, as shown in FIG. 21B, an insulating section 83 is formed to bury the second opening OP2. Formation of the insulating section 83 can use a method similar to the formation of the insulating section 80a. The material of the insulating section 83 can be a material similar to that of the insulating section 80a.

After the second opening OP2 is buried, an excess insulating material, if any, on the surface may be removed by a method such as CMP technique to planarize the surface. At this time, the insulating material on the surface is removed so as to expose the portion of the second layer 21b provided on the second electrode 31.

Figure 22A:
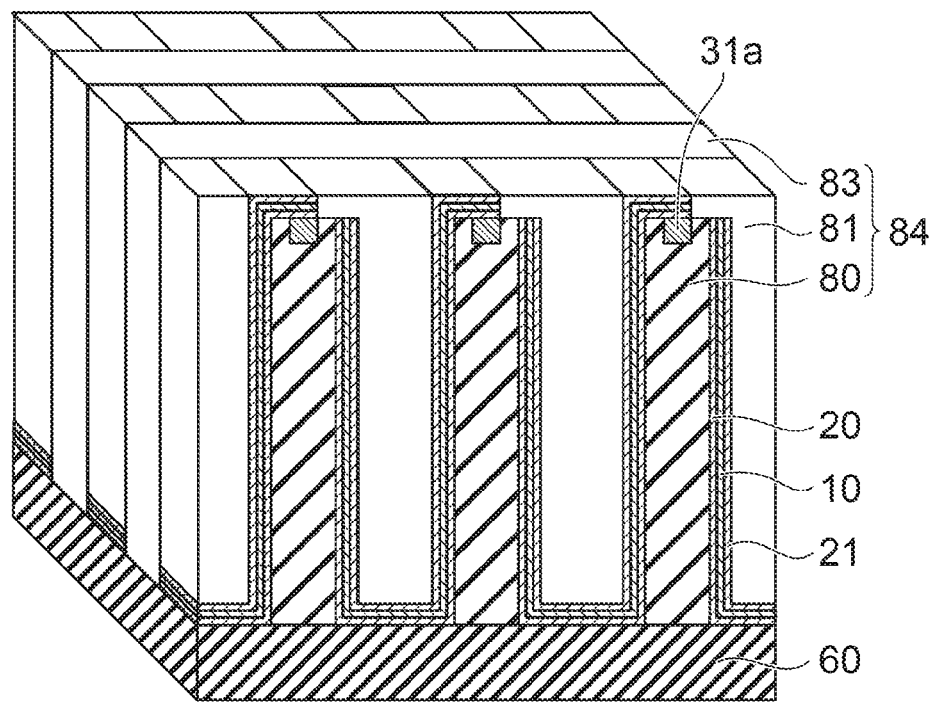

Next, as shown in FIG. 22A, part of the portion of the first magnetic section 10b formed on the insulating section 80 is removed. By this step, the first magnetic section 10b is separated into a plurality in the X-direction to form first magnetic sections 10. That is, the portion of the first magnetic section 10b formed on the upper surface of the insulating section 80 is separated from the portion of the first magnetic section 10b formed on one side surface of the insulating section 80. Likewise, the first layer 20b and the second layer 21b are separated into a plurality in the X-direction to form first layers 20 and second layers 21. In the case where the first layer 20 includes a dielectric material, the first layer 20 may not be separated.

Next, a nonmagnetic layer and a magnetic layer are formed on the second layer 21 made of the insulating sections 80, 81, and 83. The nonmagnetic layer and the magnetic layer are processed into an MTJ 42 on the second layer 21 as shown in FIG. 22B.

Figure 22B:
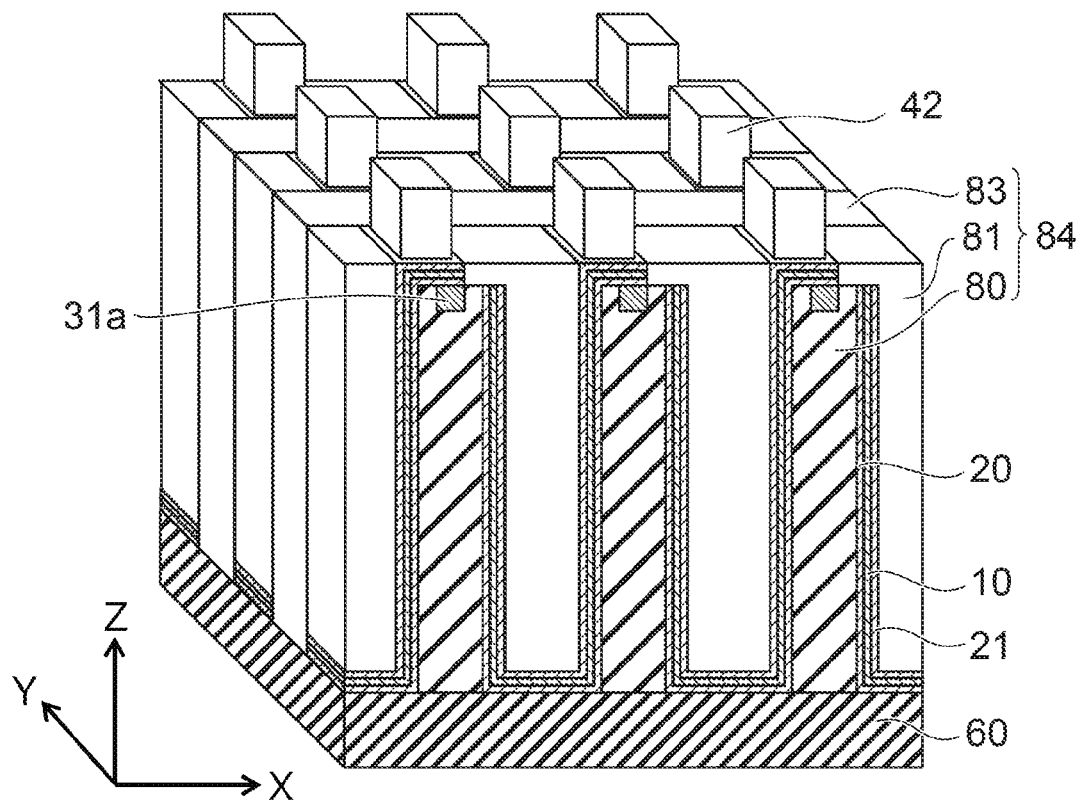

In the example shown in FIG. 22B, the MTJ 42 is formed at a position opposed to the second electrode 31 across the first layer 20, the first magnetic section 10, and the second layer 21.

The magnetic memory device 300 shown in FIG. 17 is obtained by the foregoing process.

In the magnetic memory device 300 according to this embodiment, the occurrence of pinning sites in the extending portion 11 can be reduced. Like the magnetic memory device 200, the magnetic memory device 300 according to this embodiment includes an extending portion 11 extending in the first direction crossing the surface of the substrate 60. This can increase the recording density per unit area of the substrate 60.

Figure 23:
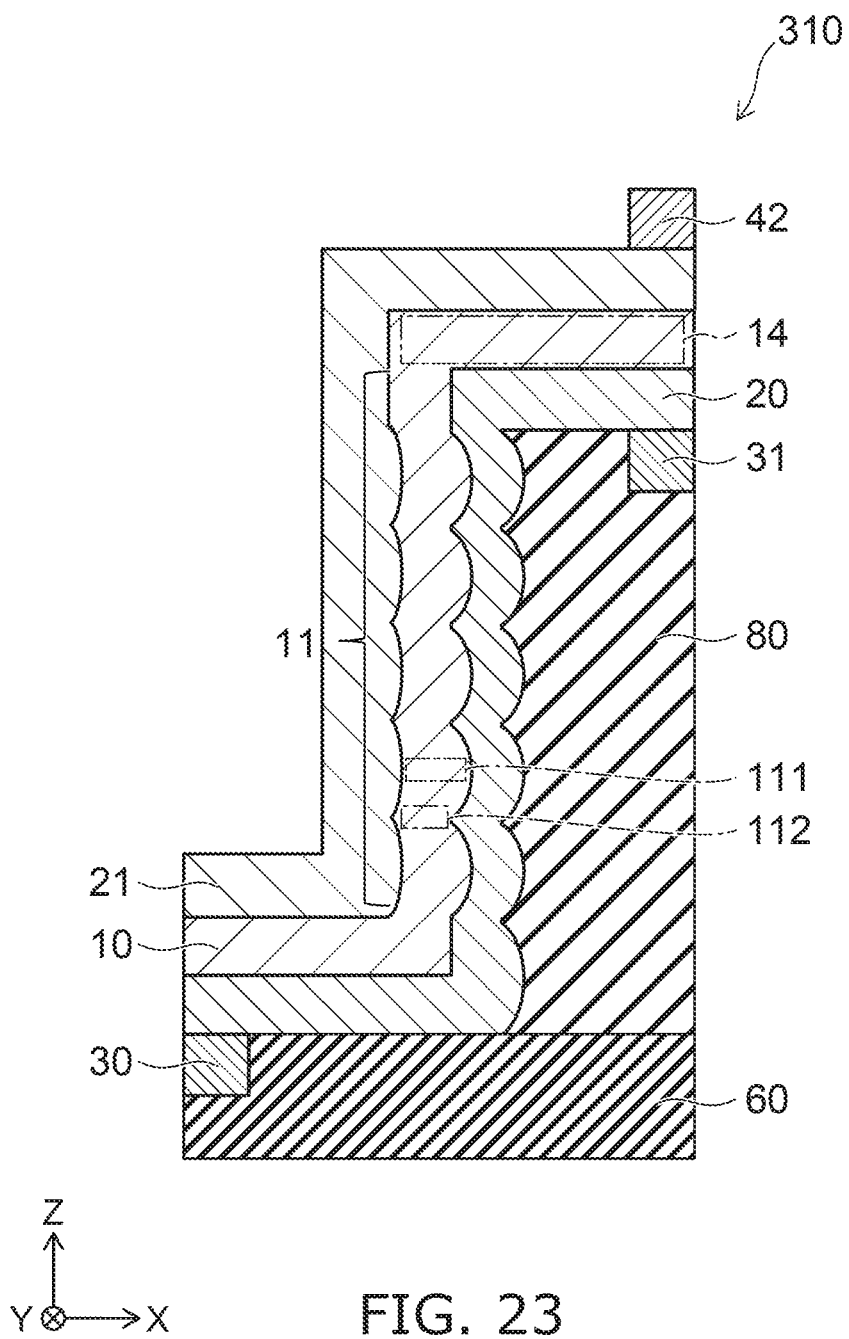
FIG. 23 is a sectional view showing an alternative magnetic memory device 310 according to the third embodiment.

FIG. 23 is a sectional view showing an alternative magnetic memory device 310 according to the third embodiment.

The magnetic memory device 310 is different from the magnetic memory device 300 in e.g. the structure of the first magnetic section 10. The structure of the magnetic memory device 310 except the first magnetic section 10 can be based on a structure similar to that of e.g. the magnetic memory device 300.

In the magnetic memory device 310, as in the magnetic memory device 210, the extending portion 11 includes a plurality of first portions 111 and a plurality of second portions 112. The distance between one end in the second direction of the first portion 111 and the other end in the second direction of the first portion 111 is larger than the distance between one end in the second direction of the second portion 112 and the other end in the second direction of the second portion 112. The extending portion 11 includes a plurality of first portions 111 and a plurality of second portions 112. The first portions 111 and the second portions 112 are arranged alternately in the first direction.

As shown in FIG. 23, the first layer 20 and the second layer 21 may also alternately include portions having a relatively large distance and portions having a relatively small distance between one end and the other end in the second direction.

The magnetic memory device 310 is formed by e.g. the following method.

In the step shown in FIG. 19B, the insulating section 80a is formed by alternately stacking two or more layers different in anisotropy of etching rate. Then, in the step shown in FIG. 19C, the insulating section 80a is etched using RIE technique. This can form an opening OP1 in which the width in the second direction is periodically changed in the first direction. In the step shown in FIG. 20A, a first magnetic section 10a is formed on the inner wall of this opening OP1. This can form a first magnetic section 10a including a first portion 111 and a second portion 112.

Subsequently, steps similar to the steps shown in FIGS. 21A to 22B are performed. Thus, the magnetic memory device 310 shown in FIG. 23 is obtained.

The magnetic memory device 310 shown in FIG. 23 can reduce the possibility of shift error of the magnetic domain wall when the magnetic domain wall moves in the extending portion 11.

Fourth Embodiment

Figure 24:
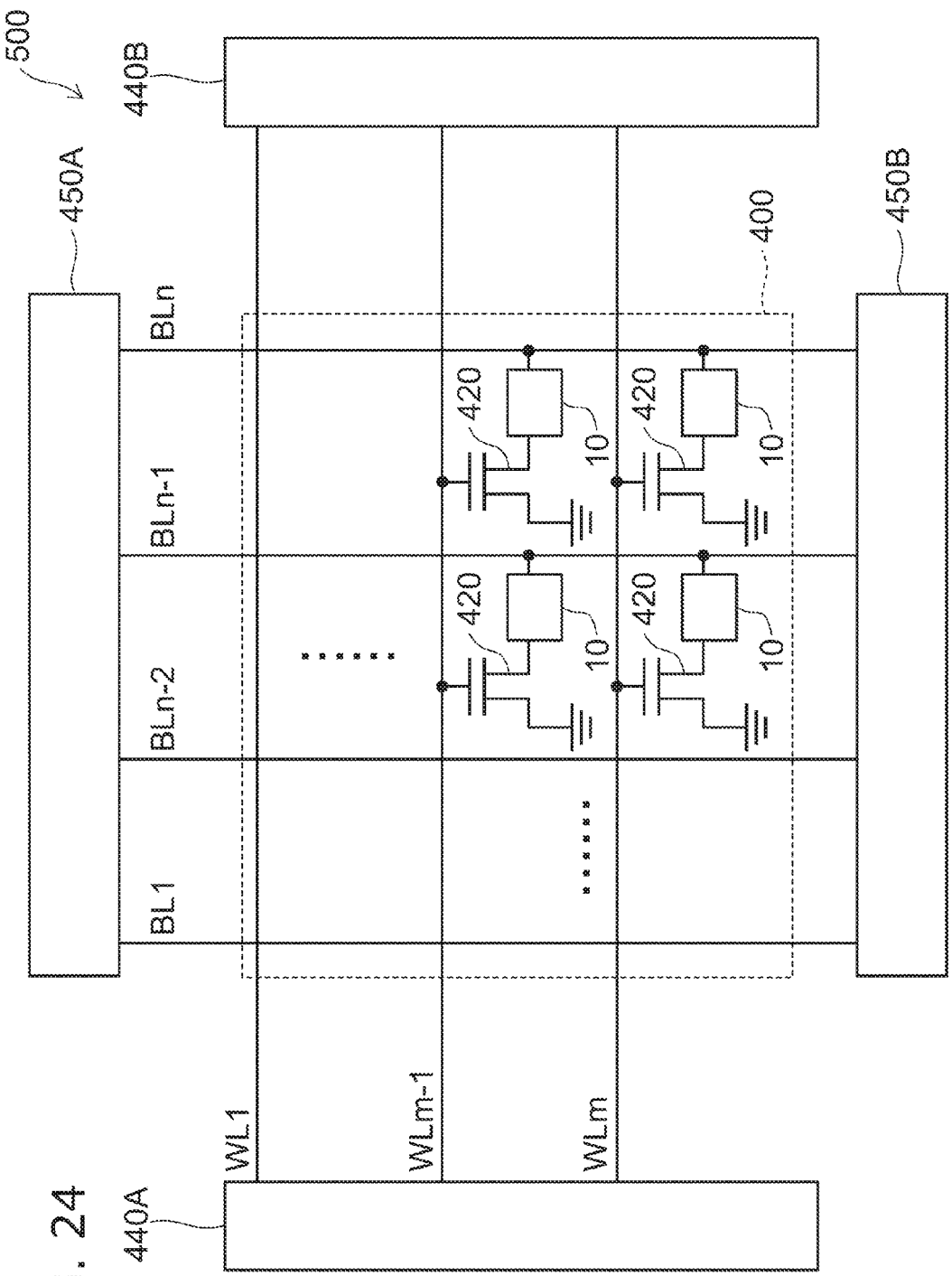
FIG. 24 is a circuit diagram of a magnetic memory 500 according to a fourth embodiment.

FIG. 24 is a circuit diagram of a magnetic memory 500 according to a fourth embodiment.

Figure 25:
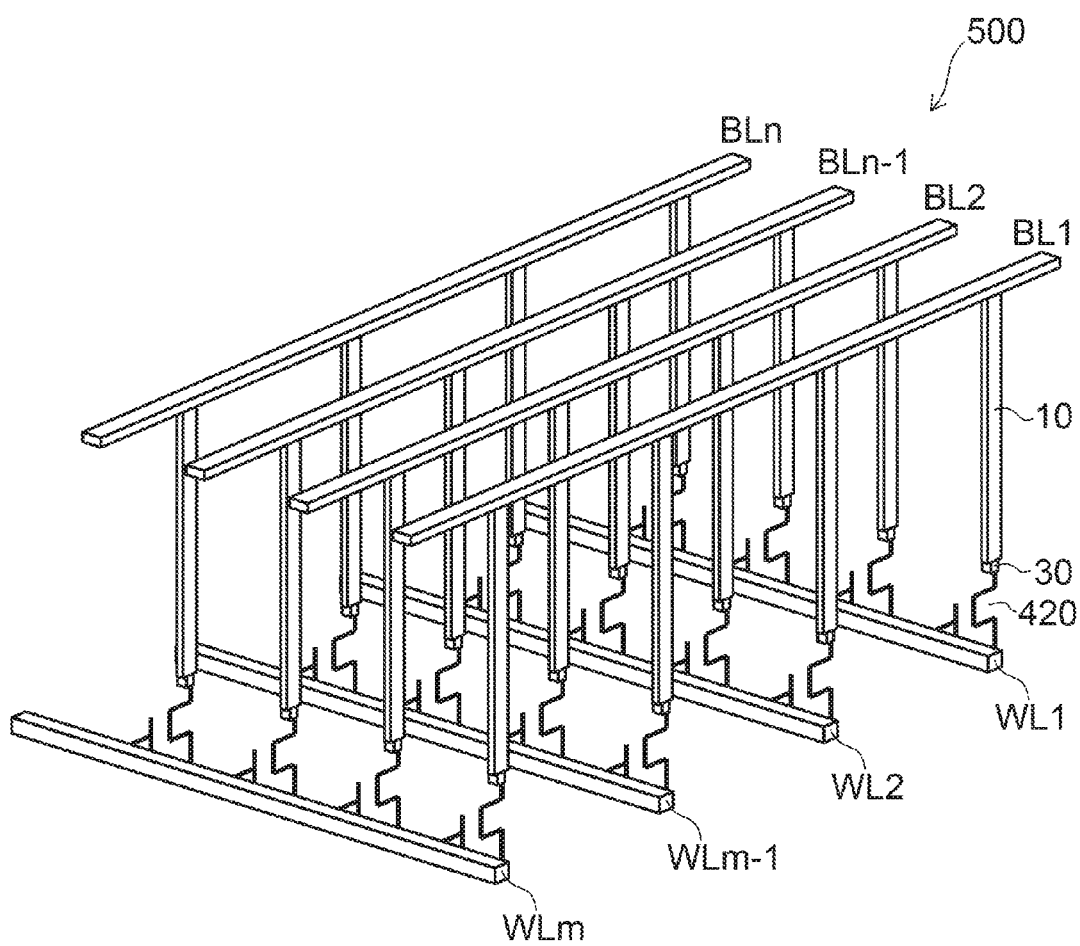
FIG. 25 is a perspective view of the magnetic memory 500 according to the fourth embodiment.

FIG. 25 is a perspective view of the magnetic memory 500 according to the fourth embodiment.

The magnetic memory 500 according to the fourth embodiment includes a magnetic memory device array 400. This magnetic memory device array 400 includes a plurality of magnetic memory devices arranged in a matrix. Each magnetic memory device includes the magnetic memory device 100 according to the first embodiment and a transistor 420. The magnetic memory device may be the magnetic memory device 200 according to the second embodiment. The magnetic memory device array 400 includes word lines WL1-WLm provided on respective rows and bit lines BL1-BLn provided on respective columns.

Each of n magnetic memory devices 100 on the i-th (1≤i≤m) row is connected to a transistor 420. The gate of the transistor 420 is connected to the word line WLi (1≤i≤m) of the corresponding row. One terminal except the gate of the transistor 420 is connected to one of the first electrode 30 and the second electrode 31 of the magnetic memory device 100. The other terminal except the gate of the transistor 420 is connected to e.g. a ground potential. The other of the first electrode 30 and the second electrode 31 of the magnetic memory device 100 is connected to the bit line BLj (1≤j≤n) corresponding to the magnetic memory device 100.

These word lines WL1-WLm are connected to driving circuits 440A, 440B including e.g. decoders for selecting respective wirings and write circuits. The bit lines BL1-BLn are connected to driving circuits 450A, 450B including e.g. decoders for selecting respective wirings and read circuits.

In FIGS. 24 and 25, the read section 40 and the write section 41 of the magnetic memory device 100 are not shown. For instance, one end of the read section 40 is connected to a transistor for selecting the read section, not shown. The other end of the read section 40 is connected to a current source, not shown. One end of the write section 41 is connected to a transistor for selecting the write section, not shown. The other end of the write section 41 is connected to a current source, not shown.

The transistor for selecting the write section and the transistor for selecting the read section may be in common. One read section 40 and one write section 41 may be provided for a plurality of magnetic memory devices 100. This can increase the degree of integration. As shown in FIGS. 24 and 25, one read section 40 and one write section 41 may be provided for each magnetic memory device 100. This can increase the data transfer rate.

An example of the movement of the magnetic domain wall in the magnetic memory device array 400 according to this embodiment is described. An externally inputted address signal is decoded by the decoders in the driving circuits 440A, 440B, 450A, 450B. A first magnetic section 10 corresponding to the decoded address is selected. A magnetic domain wall is moved by passing a current in this selected first magnetic section 10.

In the case of writing to the magnetic memory device 100, an externally inputted address signal is decoded by the decoders in the driving circuits 440A, 440B, 450A, 450B. A word line WL corresponding to the decoded address is selected to turn on the corresponding transistor 420. Writing is performed by passing a current in the bit line BL. Alternatively, the data stored in the corresponding magnetic section is moved as necessary, and then writing is performed.

In the case of reading data stored in the magnetic memory device 100, an externally inputted address signal is decoded by the decoders in the driving circuits 440A, 440B, 450A, 450B. A magnetic memory device 100 corresponding to the decoded address is selected. Shifting of data is performed by the aforementioned method so that in the bit string stored as magnetization directions in the magnetic memory device 100, the bit to be read is located in the read section. Reading is performed by passing a read current. The direction of the read current may be either positive or negative. However, the read current preferably has an absolute value smaller than the absolute value of the write current. This is intended to reduce the possibility that reading causes the reversal of the magnetization direction of the magnetic domain subjected to the read operation.

This embodiment can provide a magnetic memory capable of stably moving the magnetic domain wall in the extending portion 11 by forming a memory array from the magnetic memory devices 100 according to the first embodiment or the magnetic memory devices 200 according to the second embodiment.

Figure 26:
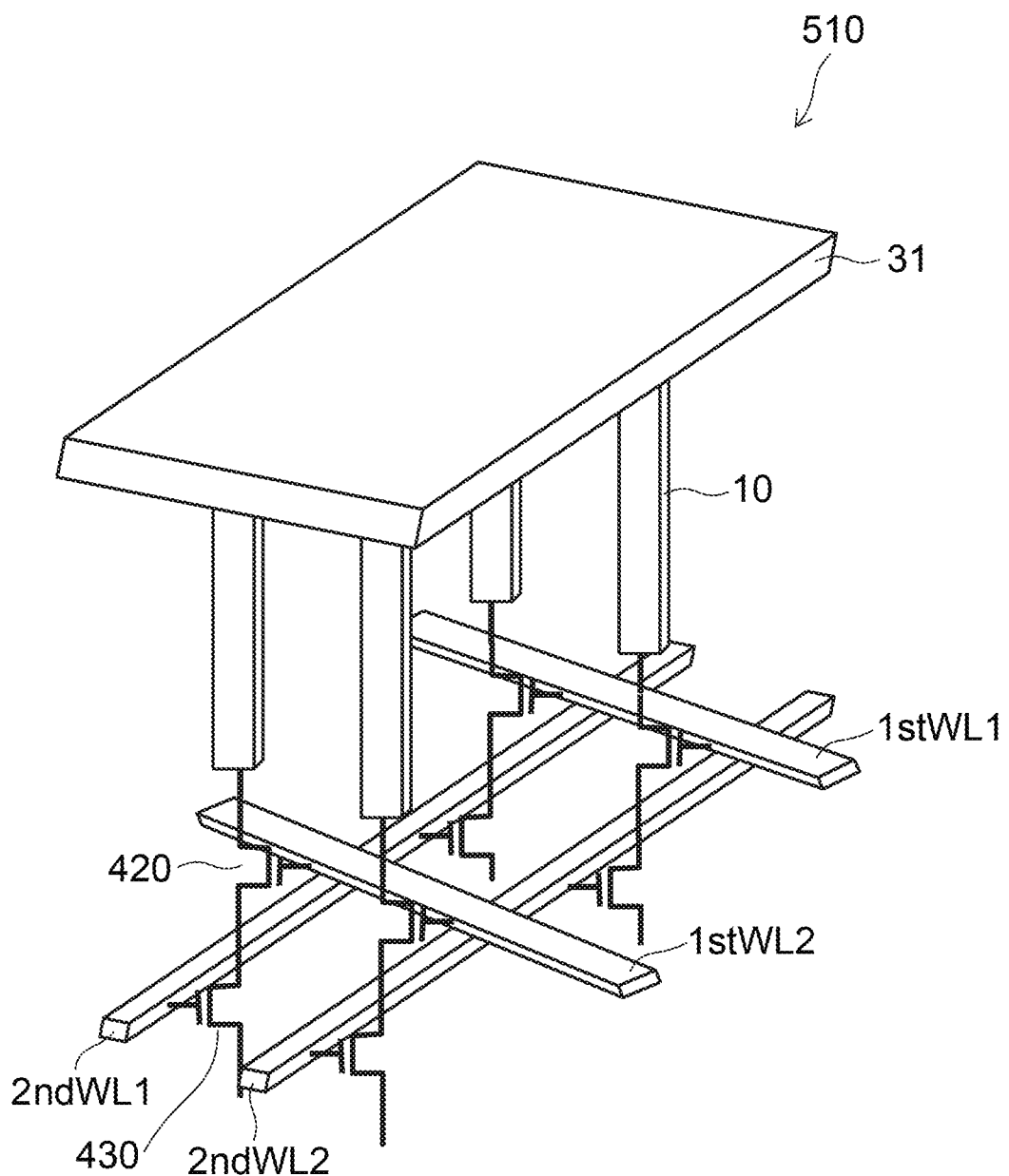
FIG. 26 is a perspective view of an alternative magnetic memory 510 according to the fourth embodiment.

FIG. 26 is a perspective view of an alternative magnetic memory 510 according to the fourth embodiment.

The magnetic memory 510 includes the magnetic memory devices 100 according to the first embodiment, a first transistor 420, a second transistor 430, first word lines 1stWL1-1stWLm, and second word lines 2ndWL1-2ndWLm.

Each magnetic memory device 100 is connected to the first transistor 420 and the second transistor 430. The gate of the first transistor 420 is connected to the first word line 1stWLi (1≤i≤m) of the corresponding row. One terminal except the gate of the first transistor 420 is connected to the first electrode 30 of the magnetic memory device 100.

The gate of the second transistor 430 is connected to the second word line 2ndWLi (1≤s≤n) of the corresponding row. The other terminal except the gate of the first transistor 420 is connected to one terminal except the gate of the second transistor 430. The other terminal except the gate of the second transistor 430 is connected to e.g. a ground potential. The second electrode 31 of the magnetic memory device 100 is provided common to a plurality of magnetic memory devices 100. That is, a plurality of first magnetic sections 10 are connected to the common second electrode 31.

In the example shown in FIG. 26, the second electrode 31 of a plurality of magnetic memory devices 100 is shared in the magnetic memory device array. This facilitates forming the second electrode 31 on the extending portion 11 when the extending portion 11 is formed in the direction perpendicular to the substrate surface.

(Clause 1)

A magnetic memory comprising:

a plurality of magnetic memory devices, the magnetic memory device including:

a first magnetic section including an extending portion extending in a first direction, the extending portion having a first interface extending along the first direction and a second interface extending along the first direction on opposite side from the first interface, the extending portion including a plurality of magnetic domains arranged along the first direction, magnetization easy axis of the extending portion being directed along a second direction crossing the first direction, and the extending portion including:

a first region provided between the first interface and the second interface and containing at least one first element selected from a first group consisting of gadolinium, terbium, dysprosium, neodymium, and holmium; and a second region provided between the first region and the first interface and containing at least one second element selected from a second group consisting of iron, cobalt, nickel, boron, silicon, and phosphorus, concentration of the first element in the second region being lower than concentration of the first element in the first region;

a read section configured to read magnetization direction of the magnetic domain in the extending portion;

a write section configured to control the magnetization direction of the magnetic domain in the extending portion; and a first electrode connected to the first magnetic section;

a first transistor including a first gate, a first terminal connected to the first electrode of one of the plurality of magnetic memory devices, and a second terminal;

a second transistor including a second gate, a third terminal connected to the first terminal, and a fourth terminal;

a first word line connected to the first gate;

a second word line connected to the second gate; and a second electrode connected to a plurality of the second electrodes.

(Clause 2)

A method for manufacturing a magnetic memory device, comprising:

forming a first magnetic layer containing at least one second element selected from a second group consisting of iron, cobalt, nickel, boron, silicon, and phosphorus; and forming a second magnetic layer on the first magnetic layer, the second magnetic layer containing at least one first element selected from a first group consisting of gadolinium, terbium, dysprosium, neodymium, and holmium, concentration of the first element in the second magnetic layer being higher than concentration of the first element in the first magnetic layer.

(Clause 3)

The method according to feature 2, further comprising:

forming a third magnetic layer on the second magnetic layer, the third magnetic layer containing the second element, and concentration of the first element in the third magnetic layer being lower than the concentration of the first element in the second magnetic layer.

(Clause 4)

A method for manufacturing a magnetic memory device, comprising:

forming a first magnetic layer containing at least one second element selected from a second group consisting of iron, cobalt, nickel, boron, silicon, and phosphorus; and alternately forming, on the first magnetic layer:

a first layer containing the second element; and a second layer containing at least one first element selected from a first group consisting of gadolinium, terbium, dysprosium, neodymium, and holmium, concentration of the first element in the second layer being higher than concentration of the first element in the first magnetic layer.

(Clause 5)

The method according to feature 4, further comprising:

forming a third magnetic layer on a stacked structure including at least one of the first layers and at least one of the second layers, the third magnetic layer containing the second element, and concentration of the first element in the third magnetic layer being lower than the concentration of the first element in the second layer.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the first magnetic section, the read section, the write section, the first electrode, the second electrode, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all magnetic memory devices and all magnetic memories practicable by an appropriate design modification by one skilled in the art based on the magnetic memory devices and the magnetic memories described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device comprising:

a first magnetic section including an extending portion extending in a first direction, the extending portion having a first interface extending along the first direction and a second interface extending along the first direction on opposite side from the first interface, the extending portion including a plurality of magnetic domains arranged along the first direction, magnetization easy axis of the extending portion being directed along a second direction crossing the first direction, and the extending portion including:

a first region provided between the first interface and the second interface and containing at least one first element selected from a first group consisting of gadolinium, terbium, dysprosium, neodymium, and holmium; and a second region provided between the first region and the first interface and containing at least one second element selected from a second group consisting of iron, cobalt, nickel, boron, silicon, and phosphorus, concentration of the first element in the second region being lower than concentration of the first element in the first region;

a read section configured to read magnetization direction of one of the magnetic domain in the extending portion; and a write section configured to control the magnetization direction of one of the magnetic domain in the extending portion.

2. The device according to claim 1, wherein
the first region contains the second element, and
concentration of the second element in the first region is higher than the concentration of the first element in the second region.

3. The device according to claim 1, wherein
the second region contains the first element, and
concentration of the second element in the second region is higher than the concentration of the first element in the second region.

4. The device according to claim 1, wherein the second element includes at least one of iron, cobalt, and nickel, and at least one of boron, silicon, and phosphorus.

5. The device according to claim 1, wherein
the first magnetic section further includes a third region provided between the first region and the second interface,
the third region contains the first element and the second element, and
concentration of the first element in the third region is lower than the concentration of the first element in the first region.

6. The device according to claim 5, wherein at least one of the second region and the third region contains at least one third element selected from a third group consisting of tantalum, tungsten, iridium, platinum, palladium, copper, aluminum, silver, gold, carbon, magnesium, and hafnium.

7. The device according to claim 1, further comprising:
a first layer; and
a second layer,
wherein the extending portion is provided between the first layer and the second layer, and
at least one of the first layer and the second layer contains at least one of tantalum, tungsten, iridium, platinum, palladium, copper, aluminum, silver, gold, carbon, silicon, magnesium, and hafnium.

8. The device according to claim 1, further comprising:
a first layer; and
a second layer,
wherein the extending portion is provided between the first layer and the second layer, and
at least one of the first layer and the second layer contains at least one of tantalum nitride, tungsten nitride, silicon nitride, aluminum nitride, magnesium oxide, aluminum oxide, silicon oxide, and hafnium oxide.

9. The device according to claim 1, wherein outer edge of a cross section of the extending portion in a plane crossing the first direction is a rectangle, trapezoid, circle, ellipse, or polygon.

10. The device according to claim 1, further comprising:
a first layer; and
a second layer extending in the first direction,
wherein the extending portion is provided around the second layer in the second direction, and
the first layer is provided around the extending portion in the second direction.

11. The device according to claim 10, wherein outer edge of a cross section of the extending portion in a plane crossing the first direction is a circle, ellipse, or polygon.

12. The device according to claim 1, wherein
the extending portion includes a plurality of first portions and a plurality of second portions arranged alternately along the first direction, and
distance between one end in the second direction of the first portion and the other end in the second direction of the first portion is larger than distance between one end in the second direction of the second portion and the other end in the second direction of the second portion.

13. The device according to claim 1, further comprising:
a first electrode connected to the first magnetic section; and
a second electrode connected to a portion of the first magnetic section, the portion being different from a portion connected with the first electrode.

14. A magnetic memory comprising:
a plurality of the magnetic memory devices according to claim 13;
a first transistor including a first gate, a first terminal connected to the first electrode of one of the plurality of magnetic memory devices, and a second terminal;
a first word line connected to the first gate; and
a first bit line connected to the second electrode of the one of the plurality of magnetic memory devices.

15. A magnetic memory device comprising:
a first magnetic section including an extending portion extending in a first direction, the extending portion having a first interface extending along the first direction and a second interface extending along the first direction on opposite side from the first interface, the extending portion including a plurality of magnetic domains arranged along the first direction, magnetization easy axis of the extending portion being directed along a second direction crossing the first direction, and the extending portion including:
a first region provided between the first interface and the second interface and containing at least one first element selected from a first group consisting of gadolinium, terbium, dysprosium, neodymium, and holmium; and
a second region provided between the first region and the first interface and containing at least one second element selected from a second group consisting of iron, cobalt, nickel, boron, silicon, and phosphorus, concentration of the first element in the second region being lower than concentration of the first element in the first region;
a second magnetic section; and
a nonmagnetic section provided between the first magnetic section and the second magnetic section.

* * * * *